United States Patent [19]
Machida et al.

[11] Patent Number: 6,159,654
[45] Date of Patent: Dec. 12, 2000

[54] NEGATIVE PHOTOSENSITIVE POLYMER COMPOSITION OF A THERMOSETTING POLYMER PRECURSOR CURABLE BY CYCLODEHYDRATION UPON HEATING

[75] Inventors: Shigeru Machida; Yoshiaki Kawamonzen, both of Kawasaki; Masayuki Oba, Yokohama, all of Japan

[73] Assignee: Kabushiki Kaisha Toshiba, Kawasaki, Japan

[21] Appl. No.: 09/221,113

[22] Filed: Dec. 28, 1998

Related U.S. Application Data

[63] Continuation of application No. 08/805,849, Mar. 3, 1997, abandoned.

[30] Foreign Application Priority Data

| Mar. 4, 1996 | [JP] | Japan | 8-045696 |
| Dec. 9, 1996 | [JP] | Japan | 8-328588 |

[51] Int. Cl.⁷ ...................................................... G03C 1/73
[52] U.S. Cl. .................................. 430/270.1; 430/281.1; 430/283.1
[58] Field of Search ............................. 430/281.1, 283.1, 430/270.1

[56] References Cited

U.S. PATENT DOCUMENTS

| 4,448,869 | 5/1984 | Kondo et al. | 430/83 |
| 4,503,140 | 3/1985 | Wright | 430/270.1 |
| 5,585,217 | 12/1996 | Oba | 430/191 |

FOREIGN PATENT DOCUMENTS

| 119719 | 9/1984 | European Pat. Off. . |
| 3342851 | 6/1985 | Germany . |
| 60-124625 | 7/1985 | Japan . |
| 6-75380 | 3/1994 | Japan . |

OTHER PUBLICATIONS

M Oba et al, "Synthesis and Evaluation of Positive–Acting Photosensitive Polyimides with Phenol Moety", Journal of Applied Polymer Science, vol. 58, 1995, pp. 1535–1542.

M. Oba, "Effect of Curing Accelerators on Thermal Imidization of Polyamic Acids at Low Temperature", Journal of Polymer Science: Part A: Polymer Chemistry, vol. 34, 1996, pp. 651–658.

M. Oba, "Effect of Cure Accelerator on Imidization of Polyamic Acid at Low Temperature", Polymer Preprints, vol. 43, No. 7, 1994, pp. 2087–2088.

Zhubanov, B.A. et al, Polycondensation opf Tricyclodecenetracarboxylic Dianhydride with Diaminodiphenyl Oxide in the Presence of Poly(4–vinylpyridine), Vysokaomol. Soedin., Ser. A (1986), 28(8), pp. 1653–1657.

An, Jeongwoong et al, "Micro–composite Systems by in–situ Formation of Liquid Crystal Polymers in Commodity Polymers", Macromol. Symp. (1995), 96 (International Conference on Liquid Crystal Polymers, 1994), pp. 111–123.

Makhija, S. et al, "Miscibility Studies in Blends of High–temperature Polymers", Polym. Mater. Sci. Eng. (1990), 63, pp. 498–504.

Durr, Heinz et al, "Preparation of Photochromic Molecules with Polymerizable Organic Functionalities", Synthesis (3), pp. 294–298, 1995.

*Primary Examiner*—Maria Nuzzolillo
*Assistant Examiner*—Laura Weiner
*Attorney, Agent, or Firm*—Oblon, Spivak, McClelland, Maier & Neustadt, P.C.

[57] ABSTRACT

A negative photosensitive polymer composition, which comprises a thermosetting polymer precursor which can be cured through cyclodehydration upon heating, and a photosensitive heat cure accelerator which is capable of accelerating a curing upon irradiation of light (cyclodehydration accelerating property). This photosensitive heat cure accelerator may be a compound which is capable of increasing molecular weight and raising volatilization temperature upon irradiation of light, or a compound which is capable of generating a carboxyl group upon irradiation of light thereby exhibiting a heat cure-accelerating property, and is formed of an aromatic hydrocarbon or aromatic heterocyclic compound having at least one hydroxyl group, substituted or unsubstituted amino group or mercapto group.

9 Claims, 1 Drawing Sheet

NEGATIVE PHOTOSENSITIVE POLYMER COMPOSITION OF A THERMOSETTING POLYMER PRECURSOR CURABLE BY CYCLODEHYDRATION UPON HEATING

This application is a continuation of application Ser. No. 08/805,849 Filed on Mar. 3, 1997 now abandoned.

BACKGROUND OF THE INVENTION

This invention relates to a negative photo-sensitive polymer composition which is suited for use in the formation of pattern of insulation film, passivation film, α-ray shielding film, optical waveguide and the like, which are employed in various electronic parts. This invention relates also to a method of forming a pattern by making use of the aforementioned negative photosensitive polymer composition, and to electronic parts provided with an insulation member or passivation member comprising a patterned polymer film.

In the ordinary semiconductor device comprising a semiconductor substrate, the surface of the semiconductor substrate bearing semiconductor elements is generally covered with a protective film called a passivation film for the purpose of improving the reliability of the semiconductor device by protecting the semiconductor elements from any influence by the outer environment. As a material for this passivation film, polyimide resin is extensively employed in view of its excellent properties such as electric properties, e.g. insulating characteristics, radiation resistance, environmental stability and heat resistance. Furthermore, this polyimide is widely employed in a semiconductor device as an α-ray shielding film, or as an interlayer insulating film for a multilayered wiring structure or for a multilayered element structure (a multichip module).

This polyimide can be easily formed into a film from polyamic acid which is a precursor for the polyimide. Namely, a varnish of polyamic acid is coated on the surface of a predetermined substrate and then the coated layer is heated at a low temperature to form a film of polyamic acid, which is then heat-treated at a high temperature thereby to cause a cyclodehydration reaction of the polyamic acid to take place, thus curing the polyamic acid film and forming a polyimide film. It is possible, with the employment of this method, to easily form a film of polyimide in spite of the fact that polyimide can be hardly worked since it is not or hardly soluble to most of organic solvents and is high in softening point. Therefore, the aforementioned method has been widely adopted in the formation of polyimide film.

Meanwhile, in the manufacture of a semiconductor device, various workings, for example, for forming a through-hole in a multilayered wiring structure or for forming a pad for effecting an electric connection with an external lead are required. In order to carry out these workings, a polyimide film formed as a passivation film or an interlayer insulating film as explained above is required to be patterned thereby to form holes or grooves of predetermined patterns. Generally, the patterning of polyimide film is performed by making use of PEP (photo-engraving process) using a photoresist. Namely, after a polyimide film is formed on the surface of a semiconductor substrate bearing a semiconductor element thereon in the method as mentioned above, a photoresist film is formed on the surface of the polyimide film and then subjected to a light exposure process followed by a development process thereby forming a resist pattern. Then, the underlying polyimide film is selectively etched by making use of this resist pattern as an etching mask thereby to form a polyimide passivation film or interlayer insulating film having a prescribed pattern.

However, the aforementioned method of forming a polyimide pattern requires two independent steps, i.e. a step of forming a polyimide film and a step of the PEP, making the method troublesome to carry out.

With a view to solve the aforementioned drawback in carrying out the method, a method of patterning a polyimide film without employing the PEP has been demanded. In response to such a demand, a resin composition comprising a polyimide precursor has been proposed.

For example, Japanese Patent Unexamined Publication S/49-115541 discloses a polyamic ester which can be obtained through a reaction between a diamino compound and tetra-carboxylic diester dichloride. Namely, according to this prior art, instead of using tetra-carboxylic dianhydride which is commonly employed in the synthesis of polyamic acid or a polyimide precursor, tetra-carboxylic diester dichloride wherein a photopolymerizable group is introduced through an ester linkage is employed. This polyamic ester exhibits a photosensitivity of negative type so that an exposed portion irradiated with light is insolubilized against a developing solution. Therefore, it is possible to carry out a patterning in the course of forming a polyimide film without requiring the step of PEP whereby to obtain a patterned polyimide film.

However, not only the process of synthesizing tetra-carboxylic diester dichloride having a photopolymerizable group, which is a raw material for the polyamic ester, but also the process of synthesizing the polyamic ester are very complicated. Moreover, the end resin product to be obtained contains unavoidably chlorine ions as an impurity. Additionally, since an organic solvent is employed as a developing solution in the process of developing a polyamic ester film, a large amount of organic solvent is required in the manufacturing line, which is undesirable in viewpoints of safety, sanitation and environment. Furthermore, a swelling of the polyiside film pattern to be obtained may be caused due to the development with an organic solvent, thereby deteriorating the resolution of pattern.

Further, Japanese Patent Publication S/59-52822 discloses, as a photosensitive resin composition of negative type as in the case of aforementioned prior art, a heat resistant photosensitive material containing a compound having a carbon—carbon double bond which is dimerizable or polymerizable by an actinic radiation and amino group. However, this photosensitive material is defective in that, when it is employed as a passivation film for a resin-encapsulated semiconductor device, the adhesivity thereof to a semiconductor substrate, to a passivation film formed of an inorganic material for protecting the surface of substrate, or to a sealing resin is insufficient. Therefore, the employment of this photosensitive material may invite a problem that the reliability of semiconductor device to be obtained would be deteriorated. Additionally, this photo-sensitive material requires the employment of an organic solvent as a developing solution, which is undesirable in viewpoint of safety.

On the other hand, Japanese Patent Unexamined Publication S/60-6365 discloses a photosensitive resin composition wherein the carboxylic group of polyamic acid is attached with an aminomethacrylic ester as a salt. However, this photosensitive resin composition is defective in that the solubility thereof to a solvent to be used is poor.

Any of these photosensitive compositions are featured in that the light exposure portion of polyamic acid is crosslinked via the photo-polymerizable group thereof thereby turning it insoluble to a developing solution. This crosslinking however accompanies a volumetric shrinkage of the resultant film so that the film will be markedly thinned as a result of the light exposure and development process, and hence it has been difficult to form a polyimide film pattern with a high precision.

As mentioned above, a method of forming a polyimide film pattern without any employment of a photoresist has been recently tried with a view to simplifying the manufacturing process, and as a result, a photosensitive composition exhibiting a photosensitivity through the attachment of a photo-polymerizable group in the form of ester or salt to the carboxylic group of polyamic acid has been developed. However, these conventional photosensitive compositions are accompanied with problems that, due to a structural restriction of polyamic acid, the synthesis thereof is difficult or the adhesivity thereof to a substrate for example is more likely deteriorated, and that, since the polyimide film to be obtained will be markedly thinned as a result of the light exposure and development process, it is difficult to form a polyimide film pattern with a high precision.

This invention has been accomplished in view of the aforementioned problems, and therefore the object of this invention is to solve the drawbacks of the prior art and to provide a negative photosensitive polymer composition which enables to form a polyimide film pattern without requiring any employment of a photoresist. Other objects of this invention are to provide a method of forming a pattern with the employment of the aforementioned negative photosensitive polymer composition and to provide electronic parts provided with a patterned polymer film formed from the aforementioned negative photosensitive polymer composition.

BRIEF SUMMARY OF THE INVENTION

According to this invention, there is provided a negative photosensitive polymer composition, which comprises a thermosetting polymer precursor which can be cured through cyclodehydration upon heating, and a cure accelerator which is capable of accelerating a curing upon irradiation of light.

According to this invention, there is further provided a method of forming a pattern, which comprises the steps of; coating the aforementioned negative photosensitive polymer composition on a surface of a substrate; forming a resin layer by heat-drying the coated photosensitive polymer composition at a temperature of not more than 150° C.; irradiating light onto a predetermined region of the resin layer; heat-treating the resin layer during or after the light-irradiating step at a temperature ranging from 50 to 200° C.; and developing the heat-treated resin layer by dissolving and removing portions of the resin layer which are not subjected to light exposure by making use of a developing solution.

According to this invention, there is further provided electronic parts, which is provided with a polymer film functioning as an insulating film, a passivation film, an optical film or a liquid crystal orientation film, the polymer film being formed through a patterning of a layer containing the aforementioned negative photosensitive polymer composition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
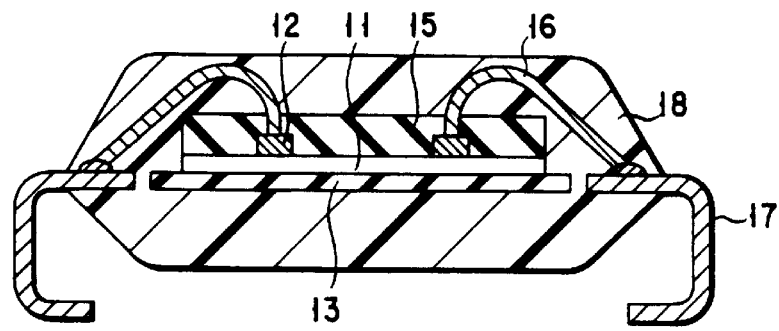
FIG. 1 is a cross-sectional view of a semiconductor element provided with a passivation film which has been obtained by patterning a film formed of a photosensitive polymer composition according to this invention.

This invention will be further explained as follows.

As for the examples of the thermosetting polymer precursor which can be cured through cyclodehydration upon heating and which can be employed in a negative photosensitive polymer composition of this invention, a polyimide precursor, polybenzoxazole precursor, polybenzothiazole precursor or polybenzimidazole precursor, polybenzoquinazolinedione precursor and polybenzoxadiazole precursor are useful. Particularly preferable examples among these thermosetting polymer precursors are polyimide precursors (polyamic acid) having a repeating unit represented by the following general formula (2).

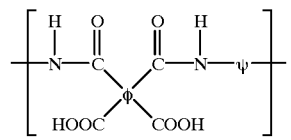
(2)

wherein $\phi$ is a quadrivalent organic group; and $\psi$ is a bivalent organic group.

The polyamic acid represented by the aforementioned general formula (2) can be synthesized through a reaction in an organic solvent between a tetracarboxylic dianhydride represented by the following general formula (3) and a diamine compound represented by the following general formula (4).

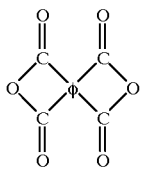

(3)

wherein φ is a quadrivalent organic group.

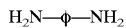

(4)

wherein φ is a bivalent organic group.

The quadrivalent organic group φ in the tetracarboxylic dianhydride represented by the general formula (3) may be selected from the group consisting of an aliphatic hydrocarbon group, an alicyclic hydrocarbon group, an aromatic hydrocarbon group, a heterocyclic group each having 1 to 30 carbon atoms and a polycyclic compound group wherein an aliphatic hydrocarbon group, an alicyclic hydrocarbon group, an aromatic hydrocarbon group or a heterocyclic group is mutually linked to each other directly or via a crosslinking group.

Examples of tetracarboxylic dianhydride represented by the general formula (3) are pyromellitic dianhydride, 3-fluoropyromellitic dianhydride, 3,6-difluoropyromellitic dianhydride, 3-trifluoromethyl pyromellitic dianhydride, 3,6-bis(trifluoromethyl)pyromellitic dianhydride, 1,2,3,4-benzenetetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 3,3'',4,4''-terphenyltetracarboxylic dianhydride, 3,3''',4,4'''-quaterphenyltetracarboxylic dianhydride, 3,3'''',4,4''''-quinquephenyltetracarboxylic dianhydride, 2,2',3,3'-biphenyltetracarboxylic dianhydride, methylene-4,4'-diphthalic dianhydride, 1,1-ethylidene-4,4'-diphthalic dianhydride, 2,2-propylidenre-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, 1,1,1,3,3,3-hexafluoro-2,2-propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,5-pentamethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)-1,1,3,3-tetramethylsiloxane dianhydride, 1,3-bis(3,4-dicarboxyphenyl)benzene dianhydride, 1,4-bis(3,4-dicarboxyphenyl)benzene dianhydride, 1,3-bis(3,4-dicarboxyphenoxy)benzene dianhydride, 1,4-bis(3,4-dicarboxyphenoxy)benzene dianhydride, 1,3-bis[2-(3,4-dicarboxyphenyl)-2-propyl]benzene dianhydride, 1,4-bis[2-(3,4-dicarboxyphenyl)-2-propyl]benzene dianhydride, bis[3-(3,4-dicarboxyphenoxy)phenyl]methane dianhydride, bis[4-(3,4-dicarboxyphenoxy)phenyl]methane dianhydride, 2,2-bis[3-(3,4-dicarboxyphenoxy)phenyl]propane dianhydride, 2,2-bis[4-(3,4-dicarboxyphenoxy)phenyl]propane dianhydride, 2,2-bis[3-(3,4-dicarboxyphenoxy)phenyl]-1,1,1,3,3,3-hexafluoropropane dianhydride, 2,2-bis[4-(3,4-dicarboxyphenoxy)phenyl]-1,1,1,3,3,3-hexafluoropropane dianhydride, bis(3,4-dicarboxyphenoxy)dimethylsilane dianhydride, 1,3-bis(3,4-dicarboxyphenyl)-1,1,3,3-tetramethyldisiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, 1,3-bis(3,4-dicarboxyphenyl)-1,1,3,3-tetramethyldisiloxane dianhydride, 1,2,3,4-butanetetracarboxylic dianhydride, 1,2,3,4-cyclobutanetetracarboxylic dianhydride, cyclopentanetetracarboxylic dianhydride, cyclohexane-1,2,3,4-tetracarboxylic dianhydride, cyclohexane-1,2,4,5-tetracarboxylic dianhydride, 3,3',4,4'-bicyclohexyltetracarboxylic dianhydride, carbonyl-4,4'-bis(cyclohexane-1,2-dicarboxylic acid) dianhydride, methylene-4,4'-bis(cyclohexane-1,2-dicarboxylic) dianhydride, 1,2-ethylene-4,4'-bis(cyclohexane-1,2-dicarboxylic) dianhydride, 1,1-ethylidene-4,4'-bis(cyclohexane-1,2-dicarboxylic) dianhydride, 2,2-propylidene-4,4'-bis(cyclohexane-1,2-dicarboxylic) dianhydride, 1,1,1,3,3,3-hexafluoro-2,2-propylidene-4,4'-bis(cyclohexane-1,2-dicarboxylic) dianhydride, oxy-4,4'-bis(cyclohexane-1,2-dicarboxylic) dianhydride, thio-4,4'-bis(cyclohexane-1,2-dicarboxylic) dianhydride, sulfonyl-4,4'-bis(cyclohexane-1,2-dicarboxylic) dianhydride, 2,2'-difluoro-3,3',4,4'-biphenyltetracarboxylic dianhydride, 5,5'-difluoro-3,3',4,4'-biphenyltetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,4'-biphenyltetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-tetrakis(trifluoromethyl)-3,3',4,4'-biphenyltetracarboxylic dianhydride, 2,2',6,6'-tetrakis(trifluoromethyl)-3,3',4,4'-biphenyltetracarboxylic dianhydride, 5,5',6,6'-tetrakis(trifluoromethyl)-3,3',4,4'-biphenyltetracarboxylic dianhydride, 2,2',5,5',6,6'-hexakis(trifluoromethyl)-3,3',4,4'-biphenyltetracarboxy dianhydride, 3,3'-difluoro-oxy-4,4'-diphthalic dianhydride, 5,5'-difluoro-oxy-4,4'-diphthalic dianhydride, 6,6'-difluoro-oxy-4,4'-diphthalic dianhydride, 3,3',5,5',6,6'-hexafluoro-oxy-4,4'-diphthalic dianhydride, 3,3'-bis(trifluoromethyl)oxy-4,4'-diphthalic dianhydride, 5,5'-bis(trifluoromethyl)oxy-4,4'-diphthalic dianhydride, 6,6'-bis(trifluoromethyl)oxy-4,4'-diphthalic dianhydride, 3,3',5,5'-tetrakis(trifluoromethyl)oxy-4,4'-diphthalic dianhydride, 3,3',6,6'-tetrakis(trifluoromethyl)oxy-4,4'-diphthalic dianhydride, 5,5',6,6'-tetrakis(trifluoromethyl)oxy-4,4'-diphthalic dianhydride, 3,3',5,5',6,6'-hexakis(trifluoromethyl)oxy-4,4'-diphthalic dianhydride, 3,3'-difluorosufonyl-4,4'-diphthalic dianhydride, 5,5'-difluorosufonyl-4,4'-diphthalic dianhydride, 6,6'-difluorosufonyl-4,4'-diphthalic dianhydride, 3,3',5,5',6,6'-hexafluorosufonyl-4,4'-diphthalic dianhydride, 3,3'-bis(trifluoromethyl)sufonyl-4,4'-diphthalic dianhydride, 5,5'-bis(trifluoromethyl)sufonyl-4,4'-diphthalic dianhydride, 6,6'-bis(trifluoromethyl)sufonyl-4,4'-diphthalic dianhydride, 3,3',5,5'-tetrakis(trifluoromethyl)sufonyl-4,4'-diphthalic dianhydride, 3,3',6,6'-tetrakis(trifluoromethyl)sufonyl-4,4'-diphthalic dianhydride, 5,5',6,6'-tetrakis(trifluoromethyl)sufonyl-4,4'-diphthalic dianhydride, 3,3',5,5',6,6'-hexakis(trifluoromethyl)sufonyl-4,4'-diphthalic dianhydride, 3,3'-difluoro-2,2-perfluoropropylidene-4,4'-diphthalic dianhydride, 5,5'-difluoro-2,2-perfluoropropylidene-4,4'- diphthalic dianhydride, 6,6'-difluoro-2,2-perfluoropropylidene-4,4'-diphthalic dianhydride, 3,3',5,5',6,6'-hexafluoro-2,2'-perfluoropropylidene-4,4'-diphthalic dianhydride, 3,3'-bis(trifluoromethyl)-2,2-perfluoropropylidene-4,4'-diphthalic dianhydride, 5,5'-bis(trifluoromethyl)-2,2-perfluoropropylidene-4,4'-diphthalic dianhydride, 6,6'-bis(trifluoromethyl)-2,2-perfluoropropylidene-4,4'-diphthalic dianhydride, 3,3',5,5'-tetrakis(trifluoromethyl)-2,2-perfluoropropylidene-4,4'-diphthalic dianhydride, 3,3',6,6'-tetrakis(trifluoromethyl)-2,2-perfluoropropylidene-4,4'-diphthalic dianhydride, 5,5',6,6'-tetrakis(trifluoromethyl)-2,2-perfluoropropylidene-4,4'-diphthalic dianhydride, 3,3',5,5',6,6'-hexakis(trifluoromethyl)-2,2-perfluoropropylidene-4,4'-diphthalic dianhydride, 9-phenyl-9-(trifluoromethyl)xanthene-2,3,6,7-tetracarboxylic dianhydride, 9,9-bis(trifluoromethyl)xanthene-2,3,6,7-tetracarboxylic dianhydride, and bicyclo[2,2,2]oct-7-ene-2,3,5,6-tetracarboxylic dianhydride.

These tetracarboxylic dianhydrides may be used singly or in combination of two or more kinds. The content of tetracarboxylic dianhydride should be 0.8 molar equivalent or more, more preferably 0.9 molar equivalent, (molar fraction) or more based on the total acid anhydride components. The reason for this is that if the content of tetracarboxylic dianhydride is less than this lower limit, the heat resistance of the polyimide resin to be obtained would be deteriorated.

The bivalent organic group ψ in the diamine compound represented by the general formula (4) may be selected from the group consisting of an aliphatic hydrocarbon group, an alicyclic hydrocarbon group, an aromatic hydrocarbon group, a heterocyclic group each having 1 to 30 carbon atoms and a polycyclic compound group wherein an aliphatic hydrocarbon group, an alicyclic hydrocarbon group, an aromatic hydrocarbon group or a heterocyclic group is mutually linked to each other directly or via a crosslinking group.

Examples of diamine compound represented by the general formula (4) are 1,2-phenylenediamine, 1,3-phenylenediamine, 1,4-phenylenediamine, 3,3'-diaminobiphenyl, 3,4'-diaminobiphenyl, 4,4'-diaminobiphenyl, 3,3"-diaminoterphenyl, 4,4"-diaminoterphenyl, 3,3'"-diaminoquaterphenyl, 4,4'"-diaminoquaterphenyl, oxy-3,3'-dianiline, oxy-4,4'-dianiline, thio-3,3'-dianiline, thio-4,4'-dianiline, sulfonyl-3,3'-dianiline, sulfonyl-4,4'-dianiline, methylene-3,3'-dianiline, methylene-4,4'-dianiline, 1,2-ethylene-3,3'-dianiline, 1,2-ethylene-4,4'-dianiline, 2,2-propylidene-3,3'-dianiline, 2,2-propylidene-4,4'-dianiline, 1,1,1,3,3,3-hexafluoro-2,2-propylidene-3,3'-dianiline, 1,1,1,3,3,3-hexafluoro-2,2-propylidene-4,4'-dianiline, 1,1,2,2,3,3-hexafluoro-1,3-propylene-3,3'-dianiline, 1,1,2,2,3,3-hexafluoro-1,3-propylene-4,4'-dianiline, 1,3-bis(3-aminophenoxy)benzene, 1,3-bis(4-aminophenoxy)benzene, 1,3-bis(3-aminophenylthio)benzene, 1,3-bis(4-aminophenylthio)benzene, 1,3-bis(3-aminophenylsulfonyl)benzene, 1,3-bis(4-aminophenylsulfonyl)benzene, 1,3-bis[2-(3-aminophenyl)-2-propyl]benzene, 1,3-bis[2-(4-aminophenyl)-2-propyl]benzene, 1,3-bis[2-(3-aminophenyl)-1,1,1,3,3,3-hexafluoro-2-propyl]benzene, 1,3-bis[2-(4-aminophenyl)-1,1,1,3,3,3-hexafluoro-2-propyl]benzene, 1,4-bis(3-aminophenoxy)benzene, 1,4-bis(4-aminophenoxy)benzene, 1,4-bis(3-aminophenylthio)benzene, 1,4-bis(4-aminophenylthio)benzene, 1,4-bis(3-aminophenylsulfonyl)benzene, 1,4-bis(4-aminophenylsulfonyl)benzene, 1,4-bis[2-(3-aminophenyl)-2-propyl]benzene, 1,4-bis[2-(4-aminophenyl)-2-propyl]benzene, 1,4-bis[2-(3-aminophenyl)-1,1,1,3,3,3-hexafluoro-2-propyl]benzene, 1,4-bis[2-(4-aminophenyl)-1,1,1,3,3,3-hexafluoro-2-propyl]benzene, 2,2-bis[4-(3-aminophenoxy)phenyl-1,1,1,3,3,3-hexafluoropropane, 2,2-bis(4-(4-aminophenoxy)phenyl-1,1,1,3,3,3-hexafluoropropane, 5-fluoro-1,3-phenylenediamine, 2-fluoro-1,4-phenylenediamine, 2,5-difluoro-1,4-phenylenediamine, 2,4,5,6-hexafluoro-1,3-phenylenediamine, 2,3,5,6-hexafluoro-1,4-phenylenediamine, 3,3'-diamino-5,5'-difluorobiphenyl, 4,4'-diamino-2,2'-difluorobiphenyl, 4,4'-diamino-3,3'-difluorobiphenyl, 3,3'-diamino-2,2',4,4',5,5',6,6'-octafluorobiphenyl, 4,4'-diamino-2,2',3,3',5,5',6,6'-octafluorobiphenyl, oxy-5,5'-bis(3-fluoroaniline), oxy-4,4'-bis(2-fluoroaniline), oxy-4,4'-bis(3-fluoroaniline), sulfonyl-5,5'-bis(3-fluoroaniline), sulfonyl-4,41-bis(2-fluoroaniline), sulfonyl-4,4'-bis(3-fluoroaniline), 1,3-bis(3-aminophenoxy)-5-fluorobenzen, 1,3-bis(3-amino-5-fluorophenoxy)benzen, 1,3-bis(3-amino-5-fluorophenoxy)-5-fluorobenzen, 5-trifluoromethyl-1,3-phenylenediamine, 2-trifluoromethyl-1,4-phenylenediamine, 2,5-bis(trifluoromethyl)-1,4-phenylenediamine, 2,2'-bis(trifluoromethyl)-4,4'-diaminobiphenyl, 3,3'-bis(trifluoromethyl)-4,4'-diaminobiphenyl, oxy-5,5'-bis(3-trifluoromethylaniline), oxy-4,4'-bis(2-trifluoromethylaniline), oxy-4,4'-bis(3-trifluoromethylaniline), sulfonyl-5,5'-bis(3-trifluoromethylaniline), sulfonyl-4,4'-bis(2-trifluoromethylaniline), sulfonyl-4,4'-bis(3-trifluoromethylaniline), 1,3-bis(3-aminophenoxy)-5-trifluoromethylbenzene, 1,3-bis(3-amino-5-trifluoromethylphenoxy)benzene, 1,3-bis(3-amino-5-trifluorom,ethylphenoxy)-5-trifluoromethylbenzene, 3,3'-bis(trifluoromethyl)-5,5'-diaminobiphenyl, bis(3-aminophenoxy)dimethylsilane, bis(4-aminophenoxy)dimethylsilane, 1,3-bis(3-aminophenyl)-1,1,3,3-tetramethyldisiloxane, 1,3-bis(4-aminophenyl)-1,1,3,3-tetramethyldisiloxane, methanediamine, 1,2-ethanediamine, 1,3-propanediamine, 1,4-butanediamine, 1,5-pentanediamine, 1,6-hexanediarnine, 1,7-heptanediamine, 1,8-octanediamine, 1,9-nonanediamine, 1,10-decanediamine, 1,2-bis(3-aminopropoxy)ethane, 1,3-diaminocyclohexane, 1,4-diaminocyclohexane, bis(3-aminocyclohexyl)methane, bis(4-aminocyclohexyl)methane, 1,2-bis(3-aminocyclohexyl)ethane, 1,2-bis(4-aminocyclohexyl)ethane, 2,2-bis(3-aminocyclohexyl)propane, 2,2-bis(4-aminocyclohexyl)propane, bis(3-aminocyclohexyl) ether, bis(4-aminocyclohexyl) ether, bis(3-aminocyclohexyl)sulfone, bis(4-aminocyclohexyl)sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylylenediamine, 1,4-xylylenediamine, 1,8-diaminonaphthalene, 2,7-diaminonaphthalene, 2,6-diaminonaphthalene, 2,5-diaminopyridine, 2,6-diaminopyridine, 2,5-diaminopyrazine, 2,4-diamino-s-triazine, 1,3-bis(aminomethyl)cyclohexane, 1,4-bis(aminomethyl)cyclohexane, 1,4-bis(3-aminopropyldimethylsilyl)benzene, and 1,3-bis(3-aminopropyl)-1,1,3,3-tetraphenyldisiloxane.

These diamine compounds may be used singly or in combination of two or more kinds. The content of diamine compound should be 0.8 molar equivalent or more, more preferably 0.9 molar equivalent or more based on the total amine compound components. The reason for this is that if the content of diamine compound is less than this lower limit, the heat resistance of the polyimide resin to be obtained would be deteriorated.

The photosensitive polymer composition of this invention may contain, in addition to a diamine compound represented by the aforementioned general formula (4), a diamine compound represented by the following general formula (5), i.e. a α,ω-bis(amino alkyl)peralkylpolysiloxane compound.

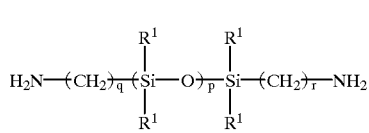

(5)

wherein R¹s may be the same or different and are individually alkyl group having 1 to 5 carbon atoms; q and r are integers ranging from 1 to 10; and p is a positive integer.

Examples of a α,ω-bis(aminoalkyl)peralkylpolysiloxane compound represented by the aforementioned formula (5) are 1,3-bis(aminomethyl)-1,1,3,3-tetramethyldisiloxane, 1,3-bis(2-aminoethyl)-1,1,3,3-tetramethyldisiloxane, 1,3-bis(3-aminopropyl)-1,1,3,3-tetramethyldisiloxane, 1,3-bis (4-aminobutyl)-1,1,3,3-tetramethyldisiloxane, 1,3-bis(5-aminopentyl)-1,1,3,3-tetramethyldisiloxane, 1,3-bis(6-aminohexyl)-1,1,3,3-tetramethyldisiloxane, 1,3-bis(7-aminoheptyl)-1,1,3,3-tetramethyldisiloxane, 1,3-bis(8-aminooctyl)-1,1,3,3-tetramethyldisiloxane, 1,3-bis(10-aminodecyl)-1,1,3,3-tetramethyldisiloxane, 1,5-bis(3-aminopropyl)-1,1,3,3,5,5-hexamethyltrisiloxane, 1,7-bis(3-aminopropyl)-1,1,3,3,5,5,7,7-octamethyltetrasiloxane, 1,11-bis(3-aminopropyl)-1,1,3,3,5,5,7,7,9,9,11,11-dodecamethylhexasiloxane, 1,15-bis(3-aminopropyl)-1,1,3,3,5,5,7,7,9,9,11,11,13,13,15,15-hexadecamethyloctasiloxane, and 1,19-bis(3-aminopropyl)-1,1,3,3,5,5,7,7,9,9,11,11,13,13,15,15,17,17,19,19-eicosamethyldecasiloxane.

The addition of this α,ω-bis(aminoalkyl) peralkylpolysiloxane compound represented by the aforementioned formula (5) is advantageous in improving the adhesion or bonding properties of polyimide resin to a glass substrate or a semiconductor substrate such as a silicon substrate. However, if the content of the α,ω-bis (aminoalkyl)peralkylpolysiloxane compound is excessive, the heat resistance of polyimide resin may be deteriorated. Therefore, the content of the α,ω-bis(aminoalkyl) peralkylpolysiloxane compound should preferably be in the range of 0.02 to 0.1 molar equivalent based on the total of diamine components.

The photosensitive polymer composition of this invention may also contain, for the purpose of controlling the polymerization degree of polyamide acid, a dicarboxylic anhydride or a monoamine compound each functioning as a polymerization regulator.

Examples of such a dicarboxylic anhydride are maleic anhydride, citraconic anhydride, dimethylmaleic anhydride, ethylmaleic anhydride, diethylmaleic anhydride, propylmaleic anhydride, butylmaleic anhydride, chloromaleic anhydride, dichloromaleic anhydride, bromomaleic anhydride, dibromomaleic anhydride, fluoromaleic anhydride, difluoromaleic anhydride, trifluoromethylmaleic anhydride, bis(trifluoromethyl)maleic anhydride, cyclobutanedicarboxylic anhydride, cyclopentanedicarboxylic anhydride, cyclohexanedicarboxylic anhydride, tetrahydrophthalic anhydride, endomethylenetetrahydrophthalic anhydride, methyltetrahydrophthalic anhydride, methylendomethylenetetrahydrophthalic anhydride, phthalic anhydride, methylphthalic anhydride, ethylphthalic anhydride, dimethylphthalic anhydride, fluorophthalic anhydride, difluorophthalic anhydride, chlorophthalic anhydride, dichlorophthalic anhydride, bromophthalic anhydride, dibromophthalic anhydride, nitrophthalic anhydride, 2,3-benzophenonedicarboxylic anhydride, 3,4-benzophenonedicarboxylic anhydride, 2,3-dicarboxydiphenyl ether anhydride, 3,4-dicarboxydiphenyl ether anhydride, 2,3-dicarboxydiphenylsulfone anhydride, 3,4-dicarboxydiphenylsulfone anhydride, 2,3-dicarboxybiphenyl anhydride, 3,4-dicarboxybiphenyl anhydride, 1,2-naphthalenedicarboxylic anhydride, 2,3-naphthalenedicarboxylic anhydride, 1,8-naphthalenedicarboxylic anhydride, 1,2-anthracene dicarboxylic anhydride, 2,3-anthracenedicarboxylic anhydride, 1,9-anthracenedicarboxylic anhydride, 2,3-pyridinedicarboxylic anhydride, 3,4-pyridinedicarboxylic anhydride, succinic anhydride, and nadeic anhydride.

Examples of the monoamine compound are methylamine, ethylamine, propylamine, butylamine, pentylamine, hexylamine, heptylamine, octylamine, 1-(3-aminopropyl)-1, 1,3,3,3-pentamethyldisiloxane, vinylamine, allylamine, glycine, alanine, aminobutyric acid, valine, norvaline, isovaline, leucine, norleucine, isoleucine, glutamine, glutamic acid, tryptophan, aminocrotonic acid, aminoacetnitrile, aminopropionitrile, aminocrotononitrile, cyclopropylamine, cyclobutylamine, cyclopentylamine, cyclohexylamine, cycloheptylamine, cyclooctylamine, aminoadamantane, aminobenzocyclobutane, aminocaprolactam, aniline, chloroaniline, dichloroaniline, bromoaniline, dibromoaniline, fluoroaniline, difluoroaniline, nitroaniline, dinitroaniline, toluidine, xylidine, ethylaniline, anisidine, phenetidine, aminoacetanilide, aminoacetophenone, aminobenzoic acid, aminobenzaldehyde, aminobenzonitrile, aminophthalonitrile, aminobenzotrifluoride, aminostyrene, aminostilbene, aminoazobenzene, aminodiphenyl ether, aminodiphenylsulfone, aminobenzamide, aminobenzenesulfoneamide, aminophenylmaleimide, aminophenylphthalimide, aminobiphenyl, aminoterphenyl, aminonaphthalene, aminoacridine, aminoanthraquinone, aminofluorene, aminopyrrolidine, aminopiperazine, aminopiperidine, aminohomopiperidine, aminomorpholine, aminobenzodioxol, aminobenzodioxane, aminopyridine, aminopyridazine, aminopyrimidine, aminopyrazine, aminoquinoline, aminocinnoline, aminophthalazine, aminoquinazoline, aminoquinoxaline, aminopyrrole, aminoimidazole, aminopyrazole, aminotriazole, aminooxazol, aminoisooxazole, aminothiazole, aminoisothiazole, aminoindole, aminobenzimidazole, aminoindazole, aminobenzoxazole, aminobenzothiazole, benzylamine, phenethylamine, phenylpropylamine, phenylbutylamine, benzhydrylamine, aminoethyl-1,3-dioxolane, aminoethylpyrrolidine, aminoethylpiperazine, aminoethylpiperidine, aminoethylmorpholine, aminopropylimidazole, aminopropylcyclohexane, aminophenol, and 2-(4-aminophenyl)-2-(4-hydroxyphenyl) propane.

The mixing ratios of these dicarboxylic anhydride and monoamine compound may be optionally selected taking the end-use and viscosity into consideration. For example, these dicarboxylic anhydride and monoamine compound may be added preferably at a ratio of 0.02 to 0.4 molar equivalent based on tetracarboxylic dianhydride and diamine compounds, respectively.

As for the method of synthesizing the polyamic acid represented by the aforementioned general formula (2), there is not any particular restriction. However, it may be preferable to carry out the polymerization thereof in an organic polar solvent which is free from water and in an inert gas atmosphere.

Examples of such an organic polar solvent which may be employed in this polymerization reaction are N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoramide, N-methyl-ε-caprolactam, N-acetyl-ε-caprolactam, 1,2-dimethoxyethane, 1,2-diethoxyethane, bis(2-methoxyethyl) ether, bis(2-ethoxyethyl) ether, 1,2-bis(2-methoxyethoxy) ethane, bis[2-(2-methoxyethoxy)ethyl] ether, 1-acetoxy-2-methoxyethane, 1-acetoxy-2-ethoxyethane, (2-acetoxyethyl)(2-methoxyethyl) ether, (2-acetoxyethyl)(2-ethoxyethyl) ether, methyl 3-methoxypropionate, tetrahydrofuran, 1,3-dioxane, 1,3-dioxolane, 1,4-dioxane, pyrroline, pyridine, picoline, dimethylsulfoxide, sulfolane, γ-butyrolactone, propylene carbonate, phenol, cresol, acetone, methylethyl ketone, methylisobutyl ketone; cyclohexanone and acetonylacetone. These organic solvents may be employed singly or in combination of two or more kinds.

The temperature of this polymerization reaction may be generally in the range of −20 to 100° C., preferably in the range of −5 to 30° C. There is any particular limitation with respect to the reaction pressure, and hence the reaction can be performed satisfactorily under the normal pressure. The reaction time depends on the kinds of tetracarboxylic dianhydride and also on the kinds of the solvent to be employed in the reaction. Generally, a time period of 0.5 to 24 hours may be sufficient for the reaction. The polyamic acid constituting a component of the photosensitive polymer composition according to this invention can be easily synthesized without accompanying any troublesome process and without being contaminated with impurities during the manufacturing process.

With regard to the intrinsic viscosity of the polyamic acid, the intrinsic viscosity of 0.5 wt % solution of the polyamic acid in N-methyl-2-pyrrolidinone at a temperature of 30° C. should be 0.3 (dl/g) or more, preferably in the range of 0.3 (dl/g) to 2.0 (dl/g). The reason for this is that if the intrinsic viscosity of the polyamic acid is too low, i.e. if the polymerization degree of the polyamic acid is too low, it is difficult to obtain a polyimide resin having a sufficient heat resistance, whereas if the intrinsic viscosity of the polyamic acid is too high, i.e. if the polymerization degree of the polyamic acid is too high, the handling of it becomes difficult.

The polyamic acid to be synthesized as mentioned above may be used in the form of a solution. Alternatively, a solution of the polyamic acid may be poured into a poor solvent, such as water, methanol, ethanol, isopropyl alcohol or acetone, whereby allowing the polyamic acid to be precipitated, the polymer thus precipitated being subsequently washed and dried to obtain a solid polymer for use.

The photosensitive polymer composition of this invention may contain, if desired, a polyimide which is soluble in an organic solvent and comprises a repeating unit represented by the following general formula (6). This polyimide can be obtained by cyclizing a precursor thereof, i.e. polyamic acid. This cyclization of polyamic acid can be performed by way of heat treatment or chemical treatment. In the method of this heat treatment, a solution of polyamic acid is heated in the presence of an organic solvent which is, together with water, capable of forming an azeotropic mixture, such as toluene, xylene or chlorobenzene, whereby giving rise to a cyclization reaction of polyamic acid, thus producing polyimide while azeotropically removing water produced. In the method of the chemical treatment, a solution of polyamic acid is subjected to a cyclization reaction at a temperature of −20 to 150° C. for one minute to 24 hours in the presence of a dehydrating agent or a catalyst such as acetic anhydride, polyphosphoric acid, triphenylphosphine, triphenylphosphite, dicyclohexylcarbodiimide, triethylamine, pyridine, choline chloride, sodium acetate, manganese acetate, or cobalt acetate.

The polyimide synthesized under the conditions as mentioned above may be used as it is, if it is prepared in the form of a solution. Alternatively, if it is prepared in the form of a suspension or slurry, the liquid may be poured into a poor solvent, such as water, methanol, ethanol, isopropyl alcohol or acetone, whereby allowing the polyimide to be precipitated, the polyimide thus precipitated being subsequently washed and dried to obtain the polyimide in the form of a solid polymer for use.

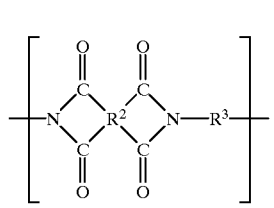

(6)

wherein $R^2$ is a quadrivalent organic group, and $R^3$ is a bivalent organic group.

When a polyamic acid having a repeating unit represented by the general formula (2) and a polyimide having a repeating unit represented by the general formula (6) are to be co-used in a photosensitive polymer composition of this invention, the polyimide may be added up to 80 wt % based on the total amount of the polyamic acid and the polyimide. If the content of this polyimide exceeds over 80 wt %, the adhesion of the resultant polyimide film to a substrate may more likely be deteriorated, and at the same time not only the exposure portions but also the unexposed portions of the polyimide film may become hardly soluble to a developing solution at the occasion of forming a pattern, thereby making it difficult to form a pattern excellent in resolution.

The photosensitive polymer composition of this invention may contain, if desired, a polyamic acid derivative having a repeating unit represented by the following general formula (7) wherein a phenolic hydroxyl group is attached to a side chain. The mixing ratio of this polyamic acid derivative should preferably be not more than 70 wt %, more preferably not more than 60 wt % based on the total amount of the aforementioned polyamic acid and the polyimide that may be added as demanded.

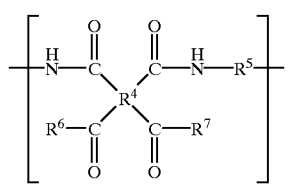

(7)

wherein $R^4$ is a quadrivalent organic group; $R^5$ is a bivalent organic group; $R^6$ and $R^7$ may be the same or different and are individually a monovalent organic group or hydroxyl group with a proviso that at least one of $R^6$ and $R^7$ is an organic group having a hydroxyl group bonded directly to an aromatic ring.

Followings are detailed explanations on a photosensitive heat cure accelerator which is capable of accelerating a thermal curing (a cyclodehydration reaction) upon irradiation of light and constitutes a component to be contained in a negative photosensitive polymer composition of this invention.

A first type of the photosensitive heat cure accelerator according to this invention is a compound which capable of increasing molecular weight and raising volatilization temperature upon irradiation of light, i.e. which exhibits a heat cure-accelerating property (a cyclodehydration reaction-accelerating property). Specific examples of such a photosensitive heat cure accelerator are nitrogen-containing heterocyclic compounds (or heterocyclic nitrogen compounds) represented by the following general formula (1).

wherein $Ar^{10}$ is a substituted or unsubstituted nitrogen-containing aromatic heterocyclic ring having pyridine type nuclear nitrogen atom (-N=) such as shown below:

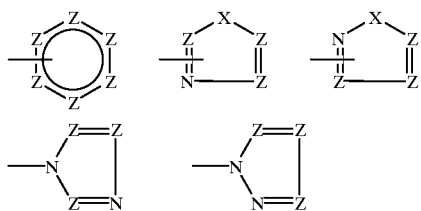

wherein —Z=is =C($R^{11}$)— or =N— (adjacent Zs may be formed into a condensed ring); and —X— is —O—, —S—, —Se—, —Te— or —N($R^{12}$)N—; wherein $R^{11}$ and $R^{12}$ represent individually a substituted or unsubstituted aromatic hydrocarbon group, heterocyclic ring group, aliphatic hydrocarbon group, alicyclic hydrocarbon group, characteristic group or hydrogen atom.

Examples of the unsubstituted nitrogen-containing aromatic heterocyclic ring to be introduced as the $Ar^{10}$ are pyridyl, quinolyl, isoquinolyl, phenanthridinyl, phenanthrolinyl, pyridazinyl, phthalazinyl, cinnolinyl, pyrimidinyl, quinazolinyl, pyrazinyl, quinoxalinyl, 1,3,5-triazinyl, 1,2,4,5-tetrazinyl, imidazolyl, benzimidazolyl, naphthoimidazolyl, pyrazolyl, indazolyl, oxazolyl, benzoxazolyl, naphthoxazolyl, isooxazolyl, benzisooxazolyl, thiazolyl, benzothiazolyl, naphthothiazolyl, selenazolyl, benzoselenazolyl, tetrazolyl, benzotetrazolyl, 1,2,3-triazolyl, 1,2,4-triazolyl, 1,2,3,5-tetrazolyl, and naphthidinyl.

Examples of a substituent group to be introduced into the nitrogen-containing aromatic heterocyclic ring so as to form a substituted nitrogen-containing aromatic heterocyclic compound are di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anicisino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pirazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureide group; semicarbazide group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; hydroxyl group; oxime group (hydroxyiminomethyl, methoxyiminomethyl, ethoxyiminomethyl and hydroxyiminoethyl, hydroxyiminopropyl group); alkoxyalkyl group (hydroxymethyl, hydroxyethyl group and hydroxypropyl group); cyano group; cyanate group; thiocyanate group; nitro group; nitroso group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfinic acid radical and the salts thereof; sulfonic acid radical and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; organosilicic group (silyl, disilanyl, trimethylsilyl and triphenylsilyl group).

Preferable examples of the nitrogen-containing aromatic heterocyclic ring to be introduced as the $Ar^{10}$ into the compound represented by the aforementioned general formula (1) are ones wherein the acid dissociation constant "pKa" of chemical species protonated to the pyridine type nuclear nitrogen atom (—N=) is in the range of pH 1 to 10. Specific examples of such a nitrogen-containing aromatic heterocyclic ring are pyridyl, quinolyl, isoquinolyl, phenanthridinyl, pyridazinyl, phthalazinyl, cinnolinyl, pyrimidinyl, quinazolinyl, imidazolyl, benzimidazolyl, pyrazolyl, indazolyl, thiazolyl, benzothiazolyl and naphthyridinyl. These nitrogen-containing aromatic heterocyclic rings may be substituted by various kinds of the aforementioned characteristic group.

Followings are detailed explanations on the $R^{11}$ which is introduced into the —Z= in the general formula (1) and on the $R^{12}$ to be introduced into the —X— in the general formula (1).

Examples of the unsubstituted aromatic hydrocarbon group to be employed for the $R^{11}$ and $R^{12}$ are benzene ring, naphthalene ring, anthracene ring, phenanthrene ring, tetralin ring, azulene ring, biphenylene ring, acenaphthylene ring, acenaphthene ring, fluorene ring, triphenylene ring, pyrene ring, chrysene ring, picene ring, perylene ring, benzopyrene ring, rubicene ring, coronene ring, ovalene ring, indene ring, pentalene ring, heptalene ring, indacene ring, phenalene ring, fluoranthene ring, acephenanthrylene ring, aceanthrylene ring, naphthacene ring, pleiadene ring, pentaphene ring, pentacene ring, tetraphenylene ring, hexaphene ring, hexacene ring, trinaphthylene ring, heptaphene ring, heptacene ring and pyranthrene ring. These aromatic hydrocarbon groups may be substituted by various kinds of the aforementioned characteristic group.

Specific examples of the unsubstituted heterocyclic group to be introduced as the $R^{11}$ and $R^{12}$ are pyrrole ring, pyrroline ring, pyrrolidine ring, indole ring, isoindole ring, indoline ring, isoindoline ring, indolizine ring, carbazole ring, carboline ring, furan ring, oxolane ring, coumarone ring, coumaran ring, isobenzofuran ring, phthalan ring, dibenzofuran ring, thiophene ring, thiolane ring, benzothiophene ring, dibenzothiophene ring, pyrazole ring, pyrazoline ring, indazole ring, imidazole ring, imidazoline ring, imidazolidine ring, benzimidazole ring, benzimidazoline ring, naphthimidazole ring, oxazole ring, oxazoline ring, oxazolidine ring, benzoxazole ring, benzoxazoline ring, naphthoxazole ring, isoxazole ring, benzisoxazole ring, thiazole ring, thiazoline ring, thiazolidine ring, benzothiazole ring, benzothiazoline ring, naphthothiazole ring, isothiazole ring, benzoisothiazole ring, triazole ring, benzotriazole ring, oxadiazole ring, thiadiazole ring, benzoxadiazole ring, benzothiadiazole ring, tetrazole ring, purine ring, pyridine ring, piperidine ring, quinoline ring, isoquinoline ring, acridine ring, phenanthridine ring, benzoquinoline ring, naphthoquinoline ring, naphthylidine ring, phenanthroline ring, pyridazine ring, pyrimidine ring, pyrazine ring, piperazine ring, phthalazine ring, quinoxaline ring, quinazoline ring, cinnoline ring, phenazine ring, perimidine ring, triazine ring, tetrazine ring, pteridine ring, oxazine ring, benzoxazine ring, phenoxazine ring, thiazine ring, benzothiazine ring, phenothiazine ring, oxadiazine ring, thiadiazine ring, dioxolane ring, benzodioxole ring, dioxane ring, benzodioxane ring, dithiolane ring, benzothiol ring, dithiane ring, benzodithiane ring, pyrane ring, chromene ring, xanthene ring, oxane ring, coumarone ring, isocoumarone ring, trioxane ring, thiane ring, trithiane ring, morpholine ring, quinuclidine ring, selenazole ring, benzoselenazole ring, naphthoselenazole ring, tellurazole ring and benzotellurazole ring. These heterocyclic groups may be substituted by various kinds of the aforementioned characteristic group.

Specific examples of the unsubstituted aliphatic hydrocarbon group to be introduced as the $R^{11}$ and $R^{12}$ are methyl, ethyl, propyl, isopropyl, butyl, isobutyl, sec-butyl, tert-butyl, pentyl, tert-pentyl, isopentyl, neopentyl, hexyl, isohexyl, heptyl, octyl, nonyl, decyl, vinyl, allyl, isopropenyl, propenyl, methalyl, crotyl, butenyl, pentenyl, butadienyl, ethynyl, propynyl, butynyl and pentynyl. These aliphatic hydrocarbon groups may be substituted by various kinds of the aforementioned characteristic group.

Specific examples of the unsubstituted alicyclic hydrocarbon group to be introduced as the $R^{11}$ and $R^{12}$ are cyclopropyl, cyclobutyl, cyclopentyl, cyclohexyl, cycloheptyl, cyclooctyl, cyclopentenyl, cyclohexenyl, cycloheptenyl, cyclooctenyl, cyclopentadienyl and cyclohexadienyl. These alicyclic hydrocarbon groups may be substituted by various kinds of the aforementioned characteristic group.

The M in the aforementioned general formul (1) is —O—, —S—, —SO—, —SO$_2$—, —CO—, —COO—, —OCO— or a bonding hand.

Specific examples of the substituted or unsubstituted aliphatic hydrocarbon group having at least one vinyl group and to be introduced as the $R^{10}$ are vinyl, allyl, propenyl, isopropenyl, butenyl, butadienyl, pentenyl, hexenyl, heptenyl, octenyl, 2-acetylvinyl, 2-benzoylvinyl, 2-carboxyvinyl, 2-(methoxycarbonyl)vinyl, 2-(ethoxycarbonyl)vinyl, 2-cyanovinyl, 2-diacetylvinyl, 2,2-dibenzoylvinyl, 2,2-dicarboxyvinyl, 2,2-bis(methoxycarbonyl)vinyl, 2,2-bis(ethoxycarbonyl)vinyl, 2,2-dicyanovinyl, 2-acetyl-2-(methoxycarbonyl)vinyl, 2-acetyl-2-(ethoxycarbonyl)vinyl, 2-acetyl-2-cyanovinyl, 2-cyano-2-(methoxycarbonyl)vinyl, 2-cyano-2-(ethoxycarbonyl)vinyl, acryloylmethyl, acryloylethyl, acryloylpropyl, methacryloylmethyl, methacryloylethyl, methacryloylpropyl, vinyloxymethyl, vinyloxyethyl, vinyloxypropyl, allyloxymethyl, allyloxyethyl, allyloxypropyl, acryloyloxymethyl, acryloyloxyethyl, acryloyloxypropyl, methacryloyloxymethyl, methacryloyloxyethyl, methacryloyloxypropyl, crotonoyloxymethyl, crotonoyloxyethyl and crotonoyloxypropyl.

Since the volatilization temperature of the nitrogen-containing heterocyclic compound is low, the compound inherently is hardly provided with a heat cure-accelerating property (a cyclodehydration reaction-accelerating property). However, when light is irradiated onto the nitrogen-containing heterocyclic compound, the photosensitive group (vinyl group) in the molecule thereof is optically crosslinked with the photosensitive groups of other molecules, thereby increasing the volatilization temperature of the compound, thus functioning as a photosensitive heat cure accelerator exhibiting a heat cure-accelerating property (a cyclodehydration reaction-accelerating property).

The photosensitive heat cure accelerator may be employed singly or in combination of two or more kinds at a mixing ratio falling within the range of not less than 0.1 molar equivalent, more preferably in the range of 1 to 4 molar equivalent. The reason for limiting the range of mixing ratio of the photosensitive heat cure accelerator is as follows. Namely, if the mixing ratio of this heat cure accelerator is less than the lower limit, the photo-sensitivity of a layer of the resultant resin may be insufficient, thereby failing to obtain a sufficient resolution, whereas if the mixing ratio of this heat cure accelerator exceeds over the upper limit, a prominent thinning of the film may be resulted so that it would be difficult to form a clear thin film.

Next, detailed explanations on a second type of the photosensitive heat cure accelerator which will be contained in a negative photosensitive polymer composition according to this invention will be followed.

The second type of the photosensitive heat cure accelerator is an aromatic hydrocarbon compound or an aromatic heterocyclic compound, which is capable of generating a carboxyl group upon the irradiation of light thereby exhibiting a heat cure-accelerating property (a cyclodehydration reaction-accelerating property) and is featured in having at least one hydroxyl group, a substituted or unsubstituted amino group, or mercapto group.

Specifically, this aromatic hydrocarbon compound or aromatic heterocyclic compound can be selected from the compounds represented by the following general formulas.

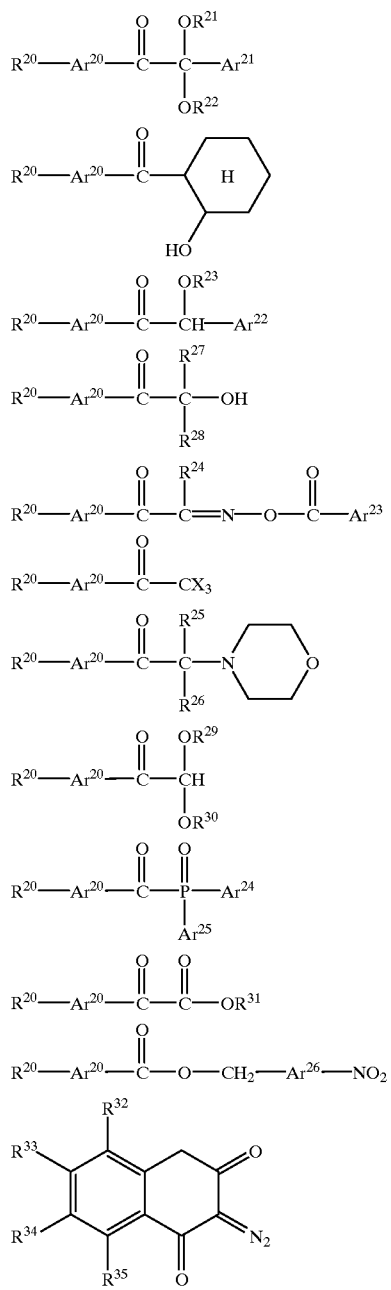

wherein $Ar^{20}$ and $Ar^{26}$ are individually a bivalent substituted or unsubstituted aromatic hydrocarbon ring or aromatic heterocyclic ring; $Ar^{21}$ to $Ar^{25}$ are individually a monovalent substituted or unsubstituted aromatic hydrocarbon ring or aromatic heterocyclic ring; $R^{20}$ represents hydroxyl group, a primary amino group, secondary amino group, tertiary amino group, cyclic amino group or mercapto group; $R^{21}$ to $R^{31}$ are individually a substituted or unsubstituted alkyl group; $R^{32}$ to $R^{35}$ are individually hydrogen atom, halogen atom, cyano, nitro, a substituted or unsubstituted alkyl group, methoxy, hydroxyl, a primary amino group, secondary amino group, tertiary amino group, cyclic amino group or mercapto group; and these groups may be connected together to form a closed ring with a proviso that at least one of them is a primary amino group, secondary amino group, tertiary amino group, cyclic amino group or mercapto group; and X is hydrogen atom or halogen atom.

The photosensitive heat cure accelerators of the second type are all capable of generating a radical of $R^{20}$—$Ar^{20}$—$C(=O)$.(wherein the definition of $R^{20}$ and $Ar^{20}$ are the same as explained above) as they are decomposed by an irradiation of light thereto. The radical thus generated takes up immediately water from the air atmosphere or from the photosensitive polymer composition, and hence is turned into an aromatic carboxylic compound. The following shows an example of the optical reaction of the photosensitive heat cure accelerators of the second type where 2,2-dimethoxy-2-phenyl-hydroxyacetophenone is employed as a photosensitive heat cure accelerator.

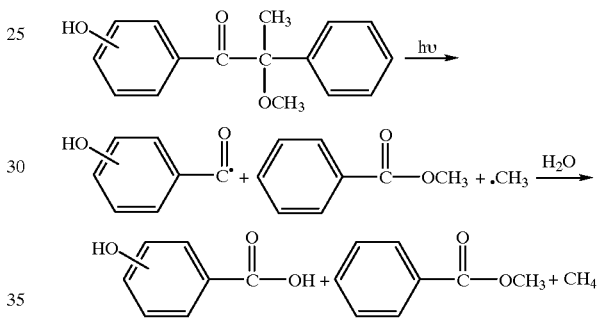

According to the photosensitive polymer composition containing a photosensitive heat cure accelerators of the second type, the aromatic carboxylic compound thus generated exhibits an excellent heat cure-accelerating property (a cyclodehydration reaction-accelerating property). Therefore, after a layer of the aforementioned photosensitive polymer composition is exposed to the irradiation of light, the layer is then heat-treated at a temperature of 50 to 200° C. In this case, since the aforementioned aromatic carboxylic compound is generated in the layer of the polymer as a result of light exposure, the cyclodehydration reaction (heat curing) of the polymer is proceeded at the exposure portions of the polymer. On the other hand, the proceeding of such a cyclodehydration reaction (heat curing) can be substantially suppressed at the unexposed portions of the polymer. Accordingly, it is possible, if a difference in solubility of the polymer layer to a developing solution between the exposure portions and unexposed portions is taken advantage of, to selectively dissolve and remove the unexposed portions of the polymer layer by making use of the developing solution, thereby to form a predetermined negative pattern.

There is not any particular restriction with regard to the kinds of the photosensitive heat cure accelerator of the second type as long as it is an aromatic carboxylic acid derivative as defined by the aforementioned general formula. Preferable examples of the aromatic hydrocarbon group to be introduced as the $Ar^{20}$ into the compounds represented by the aforementioned general formulas are phenyl, naphthyl, anthranyl, phenethyl and diphenyl. Examples of aromatic heterocyclic ring to be introduced into the compounds represented by the aforementioned general formulas are furyl, thionyl, imidazoyl, oxazoyl, thiazoyl, pyrazoyl, pyrrolidyl, pyrimidyl, quinolidyl, isoquinolidyl and carbazoyl. These aromatic hydrocarbon and aromatic heterocyclic ring according to this invention contain, as $R^{20}$, hydroxyl group, primary amino group, secondary amino group, tertiary amino group, cyclic amino group or mercapto group, and any of hydrogen atoms in these aromatic hydrocarbon group and aromatic heterocyclic ring may be substituted by at least one kind of substituent group selected from the group consisting of halogen atom, cyano, nitro, alkyl group, methoxy, etc.

In the case where any of the aforementioned aromatic hydrocarbon group and aromatic heterocyclic ring are formed of a condensed ring, it is desired in view of enhancing the sensitivity of the photosensitive heat cure accelerator that the hydroxyl group, etc. which is to be introduced as $R^{20}$, should be introduced into the same aromatic ring where a carbonyl group to be converted upon photolysis into a carboxyl group is attached to. Furthermore, if this $R^{20}$ is introduced the meta or para position in relative to the carbonyl group, the steric hindrance in terms of molecular skeleton can be preferably minimized.

Not only the substituted or unsubstituted alkyl group that may be introduced as $R^{21}$ to $R^{31}$ into the aforementioned general formulas but also the aliphatic hydrocarbon group for substituting the hydrogen atom of the aromatic hydrocarbon group or of the aromatic heterocyclic ring in the photosensitive heat cure accelerator should preferably be formed of a group having not more than 5 carbon atoms. Because, if the number of carbon atom in these groups is 6 or more, the sensitivity of the heat cure accelerator as a photosensitive agent may be deteriorated, and at the same time, a large amount of the photosensitive agent will be left as a residue at the occasion of forming a polyimide pattern by making use of the photosensitive polymer composition of this invention, thus possibly deteriorating the electric properties of the resultant polyimide film pattern. Specifically, the aliphatic hydrocarbon group to be introduced as $R^{21}$ to $R^{31}$ in the photosensitive heat cure accelerator of the second type should preferably be selected from the group consisting of methyl, ethyl, isopropyl, isobutyl, pentyl, etc.

These photosensitive heat cure accelerators of the second type may be employed singly or in combination of two or more kinds at a mixing ratio falling within the range of not less than 0.1 molar equivalent, more preferably in the range of 1 to 4 molar equivalent.

The reason for limiting the range of mixing ratio of the photosensitive heat cure accelerator is as follows. Namely, if the mixing ratio of this heat cure accelerator is less than the lower limit, the photosensitivity of a layer of the resultant resin may be insufficient, thereby failing to obtain a sufficient resolution, whereas if the mixing ratio of this heat cure accelerator exceeds over the upper limit, a prominent thinning of the film may be resulted so that it would be difficult to form a clear thin film.

This heat cure accelerator should suitably be selected from the aromatic carboxylic acid derivatives represented by the aforementioned general formula, preferably taking into consideration the light absorption wavelength of polyamic acid or of the polyimide, etc. to be optionally added to the polymer composition of this invention. Namely, if a photosensitive heat cure accelerator which is highly sensitive to a light of specific wavelength that cannot be sufficiently absorbed by polyamic acid and other components is employed, it will be possible to enhance the exposure depth, thus making it possible to form a pattern having a high aspect ratio.

If desired in view of enhancing the sensitivity of the photosensitive heat cure accelerator, a sensitizer may be added to the photosensitive polymer composition of this invention. Specific examples of such a sensitizer are acetophenone, benzophenone, benzoin, 2-methylbenzoin, benzoin isopropyl ether, anthrone, 1,9-benzoanthrone, anthracene, phenanthrenequinone, pyrene-1,6-quinone, 9-fluorenone, 1,2-benzoanthraquinone, anthoanthrone, 2-chlorobenzanthraquinone, 2-bromobenzanthraquinone, 2-chloro-1,8-phthaloylnaphthalene, Michler's ketone, 4,4'-bis(diethylamino)benzophenone, benzoin methyl ether, benzyl dimethyl ketal, 2-methyl-1-[4-(methylthio)phenyl]-2-morpholino-1-propane, 1-hydroxycyclohexyl phenyl ketone, ethyl N,N-dimethylaminobenzoate, acrydine, cyanoacrydine, nitropyrene, 1,8-dinitropyrene, 5-nitroacenaphthene, 2-nitrofluorene, 2-tertiary-butyl-9,10-anthraquinone and N-phenylmaleimide.

These sensitizers may be employed singly or in combination of two or more kinds at a mixing ratio falling within the range of not less than 0.01 molar equivalent, more preferably not less than 0.1 molar equivalent, most preferably from 0.1 to 5 molar equivalent, each based on one molar equivalent of the repeating unit of the photosensitive polymer resin. If the mixing ratio of this sensitizer falls outside this range, the developing property and film-forming property of the polymer composition may be badly affected.

If desired, a dyestuff, a surfactant, an adhesion-enhancing agent (for example, a coupling agent such as aminosilane and epoxysilane), and an alkali-soluble resin may be added to the photosensitive polymer composition of this invention. Specific examples of such an alkali-soluble resin are poly-p-vinylphenol, poly-o-vinylphenol, poly-m-isopropenylphenol, m- or p-cresolnovolak resin, xylenolnovolak resin, a copolymer of p-vinylphenol and methyl methacrylate, a copolymer of p-isopropenylphenol and maleic anhydride, and polymethacrylate.

The photosensitive polymer composition of this invention can be easily prepared by adding a photo-sensitive heat cure accelerator which is capable of exhibiting a heat cure-accelerating property (a cyclodehydration reaction-accelerating property) upon being irradiated with light to a solution, in an organic solvent, of a thermosetting polymer precursor such as polyamic acid which is capable of being thermally,cured through a cyclodehydration reaction. If desired, this photosensitive polymer composition may be further diluted with a suitable solvent. Further, it may be also possible to mix the solution of this photosensitive polymer composition with a sensitizing agent, a dyestuff, a surfactant or an alkali-soluble resin. If desired, the addition of these additives to the photosensitive polymer composition may be carried out through a filtration so as to remove any fine impurities included therein. Namely, the photo-sensitive polymer composition according to this invention can be easily prepared without undergoing any troublesome step and without any impurities being contaminated into the photosensitive polymer composition.

Examples of organic solvent to be used in the preparation of the aforementioned photosensitive polymer composition are N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoric triamide, N-methyl-ε-caprolactam, N-acetyl-ε-caprolactam, 1,2-dimethoxyethane, 1,2-diethoxyethane, bis(2-methoxyethyl) ether, bis(2-ethoxyethyl) ether, 1,2-bis(2-methoxyethoxy)ethane, bis[2-(2-methoxyethoxy)ethyl] ether, 1-acetoxy-2- methoxyethane, 1-acetoxy-2-ethoxyethane, (2-acetoxyethyl)(2-methoxyethyl) ether, (2-acetoxyethyl)(2-ethoxyethyl) ether, methyl 3-methoxypropionate, tetrahydrofuran, 1,3-dioxane, 1,3-dioxolane, 1,4-dioxane, pyrroline, pyridine, picoline, dimethylsulfoxide, sulfolane, γ-butyrolactone, propylene carbonate, phenol, cresol, acetone, methyl ethyl ketone, methyl isobutyl ketone; cyclohexanone, acetonylacetone, methyl Cellosolve, methyl Cellosolve acetate, ethyl Cellosolve acetate, butyl Cellosolve acetate, ethyl acetate, butyl acetate, isoamyl acetate, ethylene glycol dimethyl ether, ethylene glycol diethyl ether, diethylene glycol dimethyl ether, diethylene glycol diethyl ether, xylene, toluene, chlorobenzene, ethylene glycol and propylene glycol.

These organic solvents may be employed singly or in combination of two or more kinds.

Followings are detailed explanations on the method of forming a pattern by making use of a negative photosensitive polymer composition according to this invention.

First of all, a negative photosensitive polymer composition prepared as explained above is coated by way of spin coating method for instance on the surface of a substrate, and then dried by heating it with a hot plate for instance at temperature of not more than 150° C., more preferably not more than 120° C. thereby to obtain a resin layer. Since the patterning of the photosensitive polymer composition of this invention is carried out by taking advantage of a difference in cyclodehydration reaction ratio between the exposure portions and non-exposure portions that will be resulted from PEB (baking after light exposure), the resin layer may be entirely cured and the resolution of the pattern may be deteriorated if the heat drying step of the resin layer is performed at a temperature exceeding over the aforementioned upper limit.

Next, a photomask having a predetermined pattern is superimposed on the resin layer formed as described above, and then a visible light, infrared ray, ultraviolet ray or an energy beam such as EB or X-ray is irradiated to the surface of the resin layer through the photomask, thereby exposing the predetermined regions of the resin layer to light. The method of this light exposure may be carried out by means of a contact exposure system or by means of a projection exposure system.

As a result of this light exposure, the heat cure-accelerating property (or cyclodehydration reaction-accelerating property) of the photosensitive heat cure accelerator is selectively worked on the light exposure portions of the resin layer, and hence the curing of unexposed portions of the resin layer can be inhibited from being cured even if the heat-treatment is performed,after the light exposure. Namely, in the case of the photosensitive heat cure accelerator of the first type (nitrogen-containing heterocyclic compound), the heat cure-accelerating property (or cyclodehydration reaction-accelerating property) is effected through an increase in molecular weight accompanied by a rise in volatilization temperature, whereas in the case of the photosensitive heat cure accelerator of the second type (aromatic carboxylic acid derivative), the heat cure-accelerating property (or cyclodehydration reaction-accelerating property) is effected through the generation of an aromatic carboxylic acid compound which is resulted from the photolysis of the heat cure accelerator.

Next, in the course of the light exposure process or in subsequent to the light exposure process, the resin layer is subjected to a heat-treatment at a temperature ranging from 50 to 200° C. by making use of a hot plate for instance. Since the heat cure-accelerating property (or cyclodehydration reaction-accelerating property) of the photosensitive heat cure accelerator is already effected at the light exposure portions of the resin layer, a thermal cure via the cyclodehydration of polyamic acid is further advanced by this heat treatment if a polyamic acid (a polyimide precursor) is employed as a base polymer, thereby forming a polyimide layer. By contrast, the curing of the polyamic acid is substantially suppressed at the unexposed portions, thus bringing about a marked difference in solubility in a developing solution of the polymer layer between the exposure portions and non-exposure portions. The temperature of this heat treatment should more preferably be in the range of from 80 to 150° C. If the resin layer is heated at a low temperature of less than 50° C. in this heat treatment, it is hardly possible to sufficiently utilize the cure-accelerating property of the photosensitive heat cure accelerator, so that the thermal curing of the polymer would hardly proceed even at the light exposure portions. On the other hand, if the resin layer is heated at a temperature higher than 200° C. in this heat treatment, the curing of the polymer would prominently proceed even at the unexposed portions. Therefore, if the temperature of this heat treatment falls outside the aforementioned range, the resolution of the resultant pattern would be deteriorated, thus making it difficult to form a fine pattern. The time required in this heat treatment is, though dependent on the temperature of this heat treatment, generally in the range of 0.5 to 60 minutes, more preferably in the range of 1 to 20 minutes. If the time for this heat treatment is too short, the thermal curing at the exposure portions would not proceed sufficiently, whereas if the time for this heat treatment is too long, the thermal curing of the polymer would markedly proceed even at the unexposed portions. Therefore, if the time for this heat treatment falls outside the aforementioned range, the resolution of the resultant pattern would be deteriorated, thus making it difficult to form a fine pattern.

After this heat treatment, the resin layer is subjected to a development process by means of a dipping method or a spray method, using a suitable developing solution. As for the developing solution to be utilized in this method, an organic solvent type developing solution or an aqueous alkaline solution type developing solution may be employed.

Specific examples of such an organic solvent type developing solution are polar organic solvents such as N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoric triamide, dimethylsulfoxide, N-methyl-ε-caprolactam and N-acetyl-ε-caprolactam. These solvents may be employed singly or as a mixed solution together with a poor solvent for the polymer, such as methanol, ethanol, isopropyl alcohol, benzene, toluene, xylene, methyl Cellosolve or water.

Specific examples of such an aqueous alkaline solution type developing solution are an aqueous solution of organic alkali, such as tetramethylammonium hydroxide, tetraethylammonium hydroxide, choline, propylamine, butylamine, monoethanolethylenediamine, trimethylenediamine, trimethylammoniumhydroxide, hydrazine and trimethylhydroxyethylammonium hydroxide; and an aqueous solution of inorganic alkali, such as sodium hydroxide, potassium hydroxide, lithium hydroxide, sodium carbonate, potassium carbonate, ammonium carbonate, hydrogen potassium carbonate, ammonium phosphate and ammonia. These aqueous solutions may be mixed with an organic solvent such as methanol, ethanol, isopropyl alcohol, ethylene glycol, ethylene Cellosolve, butyl Cellosolve, diethylene glycol, diethylene glycol monoethyl ether, N-methylpyrrolidinone, N,N-dimethylformamide, N,N-dimethylacetamide and dimethylsulfoxide.

Although the employment of an organic solvent in the developing process is advantageous in that the contamination with a metallic impurity can be minimized, it is preferable to employ an aqueous alkaline solution type developing solution in view of safety, sanitation and environment. Furthermore, if an aqueous alkaline solution type developing solution is employed, the swelling of a polymer film pattern can be avoided.

As a result of the developing process as explained above, the unexposed portions of the resin layer can be dissolved and remove, thus obtaining a negative polymer pattern. In particular, since a photosensitive heat cure accelerator which is capable of exhibiting a heat cure-accelerating property (or cyclodehydration reaction-accelerating property) as it is irradiated with light is mixed in the photosensitive polymer composition of this invention, if a polyamic acid (a polyimide precursor) is employed as a base polymer, the cyclodehydration reaction of polyamic acid selectively takes place only at the light exposure portions of the resin layer as a result of the heat treatment after the light irradiation, thereby forming a polyimide layer which is insoluble in the developing solution. By contrast, the curing of the polyamic acid is substantially suppressed at the unexposed portions, since the heat cure-accelerating property (or cyclodehydration reaction-accelerating property) of the photosensitive heat cure accelerator cannot be brought about at the unexposed portions.

Namely, as a result of the heat treatment after the light irradiation, polyimide is formed at the light exposure portions of the resin layer, while polyamic acid is left unchanged at the unexposed portions, thus giving rise to the generation of much difference in solubility to the developing solution between the light-exposed portions and the unexposed portions of the resin layer. As a result, only the unexposed portions of the resin layer is selectively dissolved and removed in the developing process, thereby making it possible to form a fine pattern with high resolution.

It is preferable in view of removing any residue of developing solution to perform a rinsing of the resin layer after the developing process by making use of water, alcohol or acetone. It is also preferable for the purpose of not only drying the developing solution or rinsing solution but also completing the curing of any remaining uncured portions to perform a heat treatment or a vacuum heat treatment at a temperature in the range of 50 to 400° C. It is possible with this heat treatment to accomplish the cyclization reaction of polyamic acid and at the same time to allow any solvent component or decomposed materials of the cure accelerator that may be left remained in the patterned layer to be volatilized or sublimed. As a result, it is possible to obtain a desired polyimide pattern which is excellent in electric properties, heat resistance and adhesion.

It is possible according to the method of this invention to form a polyimide film without the employment of photoresist and to perform the development process with an aqueous alkaline solution, thus obviating any problems involving safety and environmental pollution.

The patterned polyimide film formed in this manner can be used as an insulating material for forming an interlayer insulating film between conductive or semiconductive layers or for forming a wiring insulation film, or as a protecting material such as a passivation film in the manufacture of many kinds of device, e.g. various kinds of electronic parts, a semiconductor element such as an LSI, a high-density printed wiring board, a thin film magnetic head, magnetic bubble memory, a solar cell, a thermal head. It is also possible to utilize the patterned polyimide film formed according to the method of this invention as an optical material for forming an optical waveguide of an optical device, or as an orientation film of liquid crystal device. Since the patterned polyimide film formed in this manner is excellent in adhesion or bonding to substrate in addition to its inherent properties of high heat resistance and low dielectric constant, it is possible to further improve the reliability of electronic parts.

The negative polymer pattern formed in this manner according to this invention is also applicable to a fine working technique using a photolithography. For example, a negative photosensitive polymer composition of this invention may be used for forming a pattern on a predetermined substrate, and then a dry etching or a wet etching is performed in the conventional manner using the aforementioned pattern as an etching mask thereby to carry out the fine working of the substrate. In this case, if a fine working of 3 $\mu$m or less (in line width) is desired, a dry etching method may be preferably employed.

In the case of wet etching method, an aqueous solution of hydrofluoric acid or an aqueous solution of ammonium fluoride may be employed for etching a silicon oxide film, an aqueous solution of phosphoric acid, an aqueous solution of acetic acid or aqueous solution of nitric acid may be employed for etching an aluminum film, and an aqueous solution of ammonium cerium nitrate may be employed for etching an chromium-based film. In the case of dry etching method, $CF_4$, $C_2F_6$, $CCl_4$, $BCl_3$, $Cl_2$, HCl, $H_2$, etc. may be employed as a dry etching gas. These etching gases may be combined if required. The conditions for the etching, i.e. the concentration of a wet etching agent in a reaction chamber, the concentration of a dry etching gas in a reaction chamber, reaction temperature and reaction time are determined depending on the combination of the kind of material on which a pattern is formed and the kind of a photosensitive polymer composition. There is not any particular limitation regarding the method of etching. The pattern formed with a photosensitive polymer composition of this invention and remaining on a substrate after an etching may be removed by making use of a release agent (for example, HE-1, Wako Junyaku Co.) or an oxygen gas plasma.

Since a negative pattern is formed through the insolubilization of polymer to developing solution without accompanying the crosslinking of polyamic acid in the method of forming a pattern according to this invention, the thinning of film through the volume shrinkage thereof can be avoided, thereby making it possible to assure the accuracy of pattern. Moreover, since there is not any particular restriction regarding the structure of polyamic acid, i.e. a polyimide precursor, it is possible to easily form a polyimide film pattern which is excellent in electric properties, in heat resistance and in adhesion. Therefore, the photosensitive polymer composition of this invention is useful not only for forming an insulating film for various kinds of electronic parts, but also for conducting a fine working on a predetermined substrate.

Followings are detailed explanations on specific examples of this invention. However, these examples should not be construed as limiting the present invention.

Polyamic acid was synthesized as follows by making use of raw materials mixed together at a predetermined mixing ratio (shown in molar equivalent) as shown in the following Table 1. First of all, 50 ml of N,N-dimethylacetamide was placed under an argon gas atmosphere into a separable flask cooled down to −5 to 5° C. by making use of a cooling medium. Then, a predetermined amount of tetracarboxylic dianhydride compound was added to the flask and dissolved with stirring to obtain a solution. Subsequently, a predetermined amount of diamine compound was dissolved in 50 ml of N,N-dimethylacetamide to obtain a solution, which was then slowly dripped into the first mentioned solution by means of a dropping funnel provided with a pressure balance tube and stirred for 4 hours. Then, the resultant solution was further stirred at room temperature to obtain three kinds of polyamic acid, i.e. PAA1, PAA2 and PAA3.

Then, the intrinsic viscosity of a 0.5 wt % solution of each of these polyamic acids in N-methyl-2-pyrrolidinone was measured at a temperature of 30° C., the results being shown in Table 1.

The tetracarboxylic dianhydride compounds, diamine compounds and the solvent employed and shown in Table 1 are as follows.

(Tetracarboxylic dianhydride compound)

PMA: Pyromellitic dianhydride.

BNTA: 3,3',4,4'-benzophenonetetracarboxylic dianhydride.

6FTA: 1,1,1,3,3,3-hexafluoro-2,2-propylidene-4,4'-diphthalic dianhydride.

(Diamine compound)

ODA: Oxy-4,4'-dianiline.

TSDA: 1,3-bis(3-aminopropyl)-1,1,3,3-tetramethyldisiloxane.

(Solvent)

DMAC: N,N-dimethylacetamide.

TABLE 1

|  | PAA1 | PAA2 | PAA3 |
|---|---|---|---|
| PMA | 1.00 | — | — |
| BNTA | — | 1.00 | — |
| 6FTA | — | — | 1.00 |
| ODA | 0.95 | 0.95 | 0.95 |
| TSDA | 0.05 | 0.05 | 0.05 |
| Solvent | DMAC | DMAC | DMAC |
| Concentration wt % | 10.82 | 12.48 | 11.75 |
| Logarithmic viscosity *) [dL/g] | 0.92 | 0.98 | 0.88 |

*) 0.5 wt % NMP(N-methyl-pyrrolidinone) solution, Temperature: 30° C.

As shown in the following Tables 2 to 4, each of the solution of polyamic acid synthesized in the process as mentioned above is mixed with a photosensitive heat cure accelerator at a predetermined mixing ratio, and stirred at room temperature to obtain a homogeneous solution. The mixed solution was then filtered with a membrane filter having a pore size of 0.5 μm, thereby to prepare the photosensitive polymer compositions of this invention (Examples 1 to 50).

TABLE 2

|  | Polyamic acid | Photosensitive cure accelerator | Mixing ratio *) |
|---|---|---|---|
| Example 1 | PAA1 | C-1 | 1.0 |
| Example 2 | PAA1 | C-1 | 1.5 |
| Example 3 | PAA1 | C-1 | 2.0 |
| Example 4 | PAA1 | C-1 | 2.5 |

TABLE 2-continued

|  | Polyamic acid | Photosensitive cure accelerator | Mixing ratio *) |
|---|---|---|---|
| Example 5 | PAA1 | C-1 | 3.0 |
| Example 6 | PAA1 | C-1 | 4.0 |
| Example 7 | PAA1 | C-1 | 2.0 |
| Example 8 | PAA1 | C-1 | 2.0 |
| Example 9 | PAA1 | C-1 | 2.0 |
| Example 10 | PAA1 | C-1 | 2.0 |
| Example 11 | PAA1 | C-1 | 2.0 |
| Example 12 | PAA1 | C-1 | 2.0 |
| Example 13 | PAA1 | C-2 | 2.0 |
| Example 14 | PAA1 | C-3 | 2.0 |
| Example 15 | PAA1 | C-4 | 2.0 |
| Example 16 | PAA1 | C-5 | 2.0 |
| Example 17 | PAA1 | C-6 | 2.0 |
| Example 18 | PAA1 | C-7 | 2.0 |
| Example 19 | PAA1 | C-8 | 2.0 |
| Example 20 | PAA1 | C-9 | 2.0 |

*) Indicated by molar ratio to a repeating unit of polyamic acid

TABLE 3

|  | Polyamic acid | Photosensitive cure accelerator | Mixing ratio *) |
|---|---|---|---|
| Example 21 | PAA1 | C-10 | 2.0 |
| Example 22 | PAA1 | C-11 | 2.0 |
| Example 23 | PAA1 | C-12 | 2.0 |
| Example 24 | PAA1 | C-13 | 2.0 |
| Example 25 | PAA1 | C-14 | 2.0 |
| Example 26 | PAA1 | H-1 | 2.0 |
| Example 27 | PAA1 | H-3 | 2.0 |
| Example 28 | PAA1 | H-4 | 2.0 |
| Example 29 | PAA1 | H-6 | 2.0 |
| Example 30 | PAA1 | H-7 | 2.0 |
| Example.31 | PAA1 | C-1 | 2.0 |
| Example 32 | PAA1 | C-4 | 2.0 |
| Example 33 | PAA1 | C-6 | 2.0 |
| Example 34 | PAA1 | C-9 | 2.0 |
| Example 35 | PAA1 | C-10 | 2.0 |
| Example 36 | PAA1 | H-1 | 2.0 |
| Example 37 | PAA1 | H-2 | 2.0 |
| Example 38 | PAA1 | H-3 | 2.0 |
| Example 39 | PAA1 | H-4 | 2.0 |
| Example 40 | PAA1 | H-5 | 2.0 |

*) Indicated by molar ratio to a repeating unit of polyamic acid

TABLE 4

|  | Polyamic acid | Photosensitive cure accelerator | Mixing ratio *) |
|---|---|---|---|
| Example 41 | PAA1 | H-6 | 2.0 |
| Example 42 | PAA1 | H-7 | 2.0 |
| Example 43 | PAA2. | H-1 | 2.0 |
| Example 44 | PAA2 | H-3 | 2.0 |
| Example 45 | PAA2 | H-4 | 2.0 |
| Example 46 | PAA2 | H-6 | 2.0 |
| Example 47 | PAA3 | H-1 | 2.0 |
| Example 48 | PAA3 | H-3 | 2.0 |
| Example 49 | PAA3 | H-4 | 2.0 |
| Example 50 | PAA3 | H-6 | 2.0 |
| Comparative Example 1 | PAA1 | None | — |
| Comparative Example 2 | PAA2 | None | — |
| Comparative Example 3 | PAA3 | None | — |
| Comparative Example 4 | PAA1 | None | — |

TABLE 4-continued

| | Polyamic acid | Photosensitive cure accelerator | Mixing ratio *) |
|---|---|---|---|
| Comparative Example 5 | PAA2 | None | — |
| Comparative Example 6 | PAA3 | None | — |
| Comparative Example 7 | | Hitachi Kasei Co. TON-5000 | |

*) Indicated by molar ratio to a repeating unit of polyamic acid

The followings are structural formulas of the photosensitive heat cure accelerators (C-1) to (C-14) shown in Tables 2 and 3.

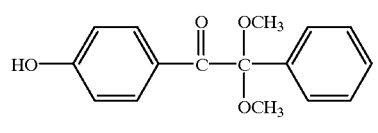
(C-1)

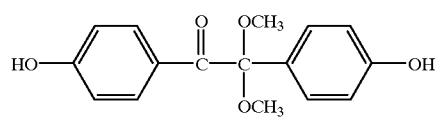
(C-2)

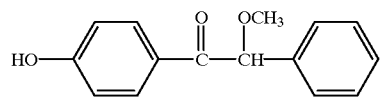
(C-3)

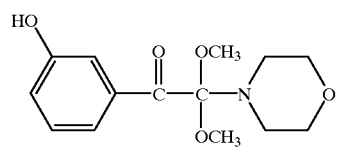
(C-4)

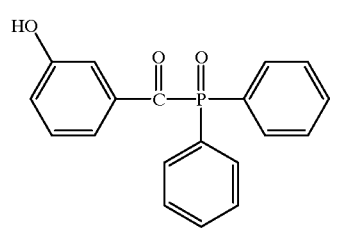
(C-5)

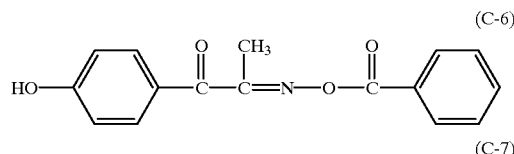
(C-6)

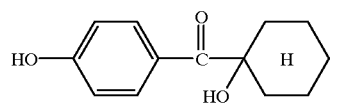
(C-7)

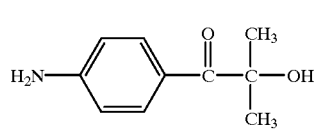
(C-8)

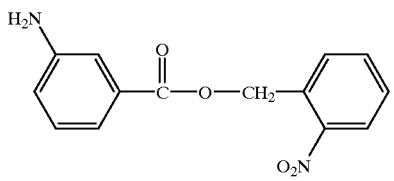
(C-9)

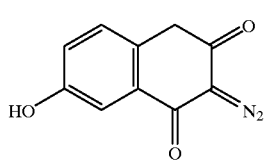
(C-10)

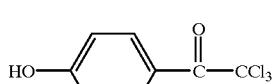
(C-11)

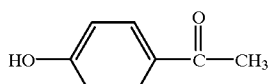
(C-12)

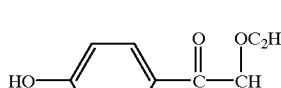
(C-13)

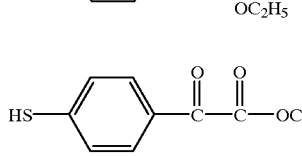
(C-14)

The followings illustrate the compounds of the photosensitive heat cure accelerators (H-1) to (H-7) shown in Tables 3 and 4.

(H-1): 4-vinylpyridine (H-2): 3-(allyloxy)pyridine (H-3): 3-(2-acetylvinyl) pyridine (H-4): (4-pyridylmethyl) methacrylate (H-5): 1-vinylimidazole (H-6): 1-allylimidazole (H-7): 1-vinylbenzimidazole On the other hand, photosensitive polymer compositions of Comparative Examples 1 to 6 were prepared without adding any of the photosensitive heat cure accelerators, and at the same time, a negative photosensitive polyimide (TON-5000, Hitachi Kasei Co.) which was available in the market was employed as Comparative Example 7. This TON-5000 contains a photo-polymerizable unsaturated group which is attached in the form of an ester to the position of carboxylic acid portion of a polyamic acid thereby to provide the polyamic acid with photo-sensitivity.

Then, these photosensitive polymer compositions were employed to form a polyimide film or pattern under the conditions shown in the following Tables 5 to 7.

TABLE 5

| | Film thickness (μm) | Exposure dose (mJ/cm$^2$) | Heating temp. (° C.) | Developing method |
|---|---|---|---|---|
| Example 1 | 5.0 | 200 | 150 | Organic solvent |
| Example 2 | 5.0 | 200 | 150 | Organic solvent |
| Example 3 | 5.0 | 200 | 150 | Organic solvent |
| Example 4 | 5.0 | 200 | 150 | Organic solvent |
| Example 5 | 5.0 | 200 | 150 | Organic solvent |
| Example 6 | 5.0 | 200 | 150 | Organic solvent |
| Example 7 | 5.0 | 200 | 100 | Organic solvent |
| Example 8 | 5.0 | 200 | 110 | Organic solvent |
| Example 9 | 5.0 | 200 | 120 | Organic solvent |
| Example 10 | 5.0 | 200 | 130 | Organic solvent |
| Example 11 | 5.0 | 200 | 140 | Organic solvent |
| Example 12 | 5.0 | 200 | 150 | Organic solvent |
| Example 13 | 5.0 | 200 | 130 | Organic solvent |
| Example 14 | 5.0 | 200 | 130 | Organic solvent |
| Example 15 | 5.0 | 200 | 130 | Organic solvent |
| Example 16 | 5.0 | 200 | 130 | Organic solvent |
| Example 17 | 5.0 | 200 | 130 | Organic solvent |
| Example 18 | 5.0 | 200 | 130 | Organic solvent |
| Example 19 | 5.0 | 200 | 130 | Organic solvent |
| Example 20 | 5.0 | 200 | 130 | Organic solvent |

TABLE 6

| | Film thickness (μm) | Exposure dose (mJ/cm$^2$) | Heating temp. (° C.) | Developing method |
|---|---|---|---|---|
| Example 21 | 5.0 | 200 | 130 | Organic solvent |
| Example 22 | 5.0 | 200 | 130 | Organic solvent |
| Example 23 | 5.0 | 200 | 130 | Organic solvent |
| Example 24 | 5.0 | 200 | 130 | Organic solvent |
| Example 25 | 5.0 | 200 | 130 | Organic solvent |
| Example 26 | 5.0 | 500 | 130 | Organic solvent |
| Example 27 | 5.0 | 300 | 130 | Organic solvent |
| Example 28 | 5.0 | 300 | 130 | Organic solvent |
| Example 29 | 5.0 | 500 | 130 | Organic solvent |
| Example 30 | 5.0 | 500 | 130 | Organic solvent |
| Example 31 | 5.0 | 200 | 150 | Alkali |
| Example 32 | 5.0 | 200 | 150 | Alkali |
| Example 33 | 5.0 | 200 | 150 | Alkali |
| Example 34 | 5.0 | 200 | 150 | Alkali |
| Example 35 | 5.0 | 200 | 150 | Alkali |
| Example 36 | 5.0 | 500 | 130 | Alkali |
| Example 37 | 5.0 | 500 | 130 | Alkali |
| Example 38 | 5.0 | 300 | 130 | Alkali |
| Example 39 | 5.0 | 300 | 130 | Alkali |
| Example 40 | 5.0 | 500 | 130 | Alkali |

TABLE 7

| | Film thickness (μm) | Exposure dose (mJ/cm$^2$) | Heating temp. (° C.) | Developing method |
|---|---|---|---|---|
| Example 41 | 5.0 | 500 | 130 | Alkali |
| Example 42 | 5.0 | 500 | 130 | Alkali |
| Example 43 | 5.1 | 500 | 130 | Alkali |
| Example 44 | 5.1 | 300 | 130 | Alkali |
| Example 45 | 5.1 | 300 | 130 | Alkali |
| Example 46 | 5.1 | 500 | 130 | Alkali |
| Example 47 | 5.0 | 500 | 130 | Alkali |
| Example 48 | 5.0 | 300 | 130 | Alkali |
| Example 49 | 5.0 | 300 | 130 | Alkali |
| Example 50 | 5.0 | 500 | 130 | Alkali |
| Comparative Example 1 | 5.0 | Not expose | 350 | |
| Comparative Example 2 | 5.1 | Not expose | 350 | |
| Comparative Example 3 | 5.0 | Not expose | 350 | |
| Comparative Example 4 | 5.0 | 1000 | 130 | Alkali |
| Comparative Example 5 | 5.1 | 1000 | 130 | Alkali |
| Comparative Example 6 | 5.0 | 1000 | 130 | Alkali |
| Comparative Example 7 | 5.0 | 200 | — | Organic Solvent |

Specifically, a solution of each photosensitive polymer composition was coated on the surface of a silicon wafer 4 inches in diameter by means of a spin-coating method, and then the coated layer was heated (pre-baking) for 10 minutes on a hot plate heated up to 80° C. thereby to form a resin layer having a film thickness of about 5 μm. Then, the resin layer was exposed through a quartz mask for resolution test to the irradiation of i-line at a predetermined exposure dose by making use of a light exposure apparatus (PLA-501FA, Canon Co.).

After this light exposure, the silicon wafer was heated for 3 minutes (PEB) on a hot plate heated up to a predetermined temperature, thereby heating the resin layer. In this case, for the purpose of investigating any possibility of simplifying the manufacturing process, the heating of the silicon wafers of Examples 31 to 35 was performed in simultaneous with the irradiation of the i-line.

Subsequently, the resin layer was allowed to cool and subjected to a developing process wherein the unexposed portions of the resin layer was selectively dissolved and removed using an organic solvent or an alkaline aqueous solution. In this case, a mixed solution consisting of N-methyl-2-pyrrolidinone (75 wt %) and isopropyl alcohol (25 wt %) was employed as an organic solvent type developing solution, and the resin layer was dipped into this organic solvent type developing solution for 120 seconds. Thereafter, the resin layer was rinsed with isopropyl alcohol for 20 seconds. On the other hand, a 2.38 wt % aqueous solution of tetramethylammonium hydroxide was employed as an aqueous alkaline solution type developing solution, and the resin layer was dipped into this aqueous alkaline solution type developing solution for 60 seconds. Thereafter, the resin layer was rinsed with water for 20 seconds. As a result, a negative pattern excellent in clearness and having a line width of 5 μm or less was obtained in either of the aforementioned processes.

Subsequently, the negative pattern thus obtained was heated for 20 minutes on the hot plate heated to 150° C. (or heated for 30 minutes on the hot plate heated to 200° C. in the case of Examples 26 to 30 and 36 to 50) so as to thermally cure the negative pattern, thereby obtaining a polyimide film pattern without any damage to the shape of pattern.

Meanwhile, in the case of Comparative Examples 1 to 3, a silicon wafer coated with each of polyamic acid varnish was placed on a hot plate provided with a nitrogen cover, and heat-cured, without being subjected to light irradiation, in a nitrogen atmosphere by way of a high temperature heat-curing process (final baking), thereby obtaining a polyimide film. This high temperature heat-curing process was performed with a heating sequence of: one hour at 150° C.—(temperature increase for 30 minutes)—one hour at 250° C.—(temperature increase for 30 minutes)—one hour at 350° C.

The evaluations on the resolution and thinning of film of each polyimide film pattern were performed as follows, and the results thereof were summarized in the following Tables 8 to 10. Namely, as for the resolution of pattern, a section of patterned film was observed with an electron microscope (SEM), while the thinning qf the film was evaluated by measuring the film thickness before the pre-baking and the film thickness after the final baking by means of a tarry step.

On the other hand, a resin layer was respectively formed by making use of the same kinds of photo-sensitive polymer composition, and the irradiation with i-line was performed all over the surface of each resin layer. Then, the same procedures as mentioned above were repeated excepting that the development process was omitted in this case, thereby forming a polyimide film. The polyimide film thus obtained was then utilized as a sample for evaluating the imidization ratio, adhesivity, tensile strength and heat resistance of the polyimide film.

The imidization ratio of the polyimide film was determined by calculating the IR spectrum of the sample obtained before the development. In this case, the imidization ratios of the polyimide films of Comparative Examples 1 to 3 were defined as being 100% for each of the polyamic acids PAA1 to PAA3, respectively.

The tensile strength was measured by making use of autograph, while the evaluation of adhesivity was performed by heating at first the sample for 24 hours at a temperature of 120° C. in a saturated aqueous vapor of 2 atmospheric pressure and then by subjecting the sample to,a cross-cut adhesion test. The evaluation of heat resistance was performed by peeling at first the resin layer with a knife and then by measuring the 3 wt %-reduction temperature (in a nitrogen gas stream) of the resin layer by means of thermogravimetric analysis (TCA). The results obtained are summarized together with the aforementioned imidization ratio and resolution in the following Tables 8 to 10.

TABLE 8

|  | Imidization ratio (%) | Resolution (μm) | Film thinning (%) | Tensile strength (kg/m$^2$) | Cross-cut adhesion test | 3 wt % reduction temp. |
| --- | --- | --- | --- | --- | --- | --- |
| Example 1 | 65.0 | 5.0 | 35 | 13.2 | 15/100 | — |
| Example 2 | 82.5 | 4.0 | 28 | 14.5 | 5/100 | — |
| Example 3 | 100.0 | 3.0 | 15 | 16.5 | 0/100 | — |
| Example 4 | 100.0 | 3.0 | 15 | 16.5 | 0/100 | — |
| Example 5 | 100.0 | 3.0 | 16 | 16.5 | 0/100 | — |
| Example 6 | 100.0 | 3.0 | 18 | 16.0 | 2/100 | — |
| Example 7 | 90.0 | 3.5 | 20 | 14.2 | 5/100 | — |
| Example 8 | 95.0 | 3.0 | 19 | 15.2 | 2/100 | — |
| Example 9 | 98.5 | 3.0 | 16 | 16.3 | 0/100 | — |
| Example 10 | 100.0 | 3.0 | 15 | 16.5 | 0/100 | 505° C. |
| Example 11 | 100.0 | 3.0 | 15 | 16.5 | 0/100 | — |
| Example 12 | 100.0 | 3.0 | 15 | 16.5 | 0/100 | — |
| Example 13 | 100.0 | 3.0 | 15 | 16.5 | 0/100 | 505° C. |
| Example 14 | 100.0 | 3.0 | 15 | 16.5 | 0/100 | 505° C. |
| Example 15 | 100.0 | 3.0 | 15 | 16.5 | 0/100 | 505° C. |
| Example 16 | 99.5 | 3.0 | 17 | 16.4 | 0/100 | 505° C. |
| Example 17 | 99.5 | 3.0 | 17 | 16.4 | 0/100 | 505° C. |
| Example 18 | 99.5 | 3.0 | 15 | 16.3 | 1/100 | 505° C. |
| Example 19 | 100.0 | 3.0 | 15 | 16.4 | 0/100 | 505° C. |
| Example 20 | 100.0 | 3.0 | 15 | 16.5 | 0/100 | 505° C. |

TABLE 9

|  | Imidization ratio (%) | Resolution (μm) | Film thinning (%) | Tensile strength (kg/m$^2$) | Cross-cut adhesion test | 3 wt % reduction temp. |
| --- | --- | --- | --- | --- | --- | --- |
| Example 21 | 99.0 | 3.0 | 17 | 16.2 | 2/100 | 505° C. |
| Example 22 | 99.5 | 3.0 | 16 | 16.3 | 0/100 | 505° C. |
| Example 23 | 99.5 | 3.0 | 16 | 16.3 | 0/100 | 505° C. |
| Example 24 | 100.0 | 3.0 | 15 | 16.5 | 0/100 | 505° C. |
| Example 25 | 100.0 | 3.0 | 15 | 16.5 | 0/100 | 505° C. |
| Example 26 | 100.0 | 3.5 | 15 | 16.5 | 0/100 | 505° C. |
| Example 27 | 100.0 | 3.0 | 15 | 16.5 | 0/100 | 505° C. |
| Example 28 | 100.0 | 3.0 | 15 | 16.5 | 0/100 | 505° C. |
| Example 29 | 100.0 | 3.5 | 15 | 16.5 | 0/100 | 505° C. |
| Example 30 | 100.0 | 3.5 | 15 | 16.5 | 0/100 | 505° C. |
| Example 31 | 99.5 | 3.0 | 15 | 16.4 | 0/100 | 505° C. |
| Example 32 | 99.5 | 3.0 | 15 | 16.4 | 0/100 | 505° C. |
| Example 33 | 98.0 | 3.0 | 17 | 16.3 | 2/100 | 505° C. |
| Example 34 | 99.0 | 3.0 | 16 | 16.4 | 0/100 | 505° C. |
| Example 35 | 98.0 | 3.0 | 17 | 16.2 | 2/100 | 505° C. |
| Example 36 | 100.0 | 3.5 | 15 | 16.5 | 0/100 | 505° C. |
| Example 37 | 100.0 | 4.0 | 15 | 16.5 | 0/100 | 505° C. |
| Example 38 | 100.0 | 3.0 | 15 | 16.5 | 0/100 | 505° C. |
| Example 39 | 100.0 | 3.0 | 15 | 16.5 | 0/100 | 505° C. |
| Example 40 | 100.0 | 4.0 | 15 | 16.5 | 0/100 | 505° C. |

TABLE 9

|  | Imidization ratio (%) | Resolution (μm) | Film thinning (%) | Tensile strength (kg/m²) | Cross-cut adhesion test | 3 wt % reduction temp. |
|---|---|---|---|---|---|---|
| Example 41 | 100.0 | 3.5 | 15 | 16.5 | 0/100 | 505° C. |
| Example 42 | 100.0 | 4.0 | 15 | 16.5 | 0/100 | 505° C. |
| Example 43 | 100.0 | 3.5 | 15 | 17.3 | 0/100 | 485° C. |
| Example 44 | 100.0 | 3.0 | 15 | 17.3 | 0/100 | 485° C. |
| Example 45 | 100.0 | 3.0 | 15 | 17.3 | 0/100 | 485° C. |
| Example 46 | 100.0 | 3.5 | 15 | 17.3 | 0/100 | 485° C. |
| Example 47 | 100.0 | 3.5 | 15 | 15.2 | 0/100 | 505° C. |
| Example 48 | 100.0 | 3.0 | 15 | 15.2 | 0/100 | 505° C. |
| Example 49 | 100.0 | 3.0 | 15 | 15.2 | 0/100 | 505° C. |
| Example 50 | 100.0 | 3.5 | 15 | 15.2 | 0/100 | 505° C. |
| Comparative Example 1 | 100.0 | — | — | 16.5 | 0/100 | 505° C. |
| Comparative Example 2 | 100.0 | — | — | 17.3 | 0/100 | 485° C. |
| Comparative Example 3 | 100.0 | — | — | 15.2 | 0/100 | 505° C. |
| Comparative Example 4 | 2.0 | X | 100 | — | — | — |
| Comparative Example 5 | 5.0 | X | 100 | — | — | — |
| Comparative Example 6 | 3.5 | X | 100 | — | — | — |
| Comparative Example 7 | — | 10 | 48 | — | — | — |

Followings are detailed explanations on each of the examples.

Examples 1 to 6 illustrate the results of investigation on the mixing ratio of the photosensitive heat cure accelerator in the instances where PAA1 was employed as a polyamic acid and an aromatic carboxylic acid derivative (C-1) was employed as a photosensitive heat cure accelerator. As shown in Table 8, when the photosensitive heat cure accelerator was employed at a ratio of 2 molar equivalents or more per repeating unit of the polyamic acid (Examples 3 to 6), it was possible to obtain a polyimide pattern which was excellent in all aspects. Namely, every samples indicated an imidization ratio of 100% and a high resolution of pattern with line width of 3.0 μm. Furthermore, the thinning of film in any of these samples was as low as not more than 18% and the tensile strength thereof was found to be not less than 16 kg/m². These samples also indicated an excellent adhesivity.

On the other hand, Examples 7 to 12 illustrate the results of investigation on the influence of the heating temperature after light exposure (PEB) in the instances where PAA1 was employed as a polyamic acid and an aromatic carboxylic acid derivative (C-1) was employed as a photosensitive heat cure accelerator. As shown in Table 8, when the PEB temperature was in the range of 120 to 150° C. (Examples 9 to 12), it was possible to obtain a polyimide pattern which was excellent in properties.

As shown in Tables 8 and 9, it is demonstrated by Examples 13 to 25 that if a photosensitive heat cure accelerator is added at the aforementioned mixing ratio and at the same time, if the temperature for the heat treatment after light exposure is suitably controlled, it is possible to form a polyimide pattern having excellent properties irrespective of the kind of the photosensitive heat cure accelerator. It is also demonstrated that even if the light exposure step and the heating step are concurrently performed (Examples 31 to 35), almost the same effects as illustrated above can be obtained.

Examples 25 to 30 and 36 to 50 illustrate the results of evaluation on the properties of a photosensitive polymer composition wherein a nitrogen-containing heterocyclic compound was employed as a photosensitive heat cure accelerator. As shown in Tables 9 and 10, it was possible, with the employment of this kind of photosensitive polymer composition, to obtain a polyimide pattern which was excellent in properties.

As explained above, the photosensitive polymer composition of this invention containing a photosensitive heat cure accelerator which is capable of exhibiting a heat cure-accelerating property upon light exposure with a dosage of 500 mJ/cm² or less is useful for forming an excellent negative pattern of line-and-space having line width of 3.0 to 5.0 μm, thus suggesting that the photosensitive polymer composition is useful for forming a passivation film or wiring-insulation film with high resolution. Moreover, most of the patterns that can be obtained according to this invention indicated a low thinning degree of the film, i.e. as low as 15 to 17%, and at the same time an excellent tensile strength and adhesivity of the pattern. Additionally, the polyimide film formed by making use of the photosensitive polymer composition of this invention exhibited no weight reduction, that might be resulted from thermal decomposition of resin, even if it is heated up to 450° C., thus demonstrating a high heat resistance of the polyimide film.

By contrast, the resin compositions (Comparative Examples 4 to 6) which include no photosensitive heat cure accelerator were incapable of forming a pattern at all even if a light irradiation with a dosage of 1,000 mJ/cm² was performed thereon. On the other hand, the photosensitive polyimide precursor composition TON-5000 (Comparative Example 7) which was available in the market indicated not only a poor resolution but also a marked film thinning, i.e. about 50% of the initial film thickness.

Next, a polyimide film pattern which was obtained by patterning a resin film formed by making use of a negative photosensitive polymer composition of this invention was employed for the manufacture of various kinds of electronic parts as shown in FIGS. 1 to 4.

FIG. 1 illustrates a cross-sectional view of a semiconductor device provided with a passivation film which was formed making use of a polymer composition of this invention. In this case, the photosensitive polymer composition of Example 45 was employed for forming a patterned polyimide film to be utilized as a passivation film.

First of all, the photosensitive polymer composition was coated on the surface of a silicon substrate (wafer) bearing thereon a pnp type transistor on which a thermal oxide film and electrodes were formed. The coated layer was prebaked for 10 minutes at a temperature of 80° C. to obtain a resin layer having a film thickness of about 10 μm. Subsequently, the resin layer was exposed through a quartz mask to the irradiation of light at a dosage of 300 mJ/cm$^2$ by making use of a light exposure apparatus (PLA-501FA, Canon Co.).

After this light exposure, the aforementioned silicon substrate was heated for 3 minutes on a hot plate heated up to 130° C., thereby heating the resin layer. Then, the silicon substrate was dipped into an alkaline developing solution (a 2.38 wt % aqueous solution of tetramethylammonium hydroxide) for 60 seconds thereby allowing the unexposed portions of the resin layer to be selectively dissolved and removed. Thereafter, the resin layer was rinsed with water for 20 seconds. Finally, the pattern thus obtained was heat-treated for 30 minutes on the hot plate heated to 200° C., thereby obtaining a polyimide film pattern.

Referring to FIG. 1, a bonding pad 12 is formed on an LSI chip 11 mounted on a tab 13, and a passivation film 15 consisting of a patterned polyimide film is superimposed thereon. The bonding pad 12 formed on the LSI chip 11 is connected via a bonding wire 16 to a lead frame 17. Furthermore, these members are entirely encapsulated with a sealing material 18.

When a passivation film 15 consisting of a patterned polyimide film formed from a photosensitive polymer composition of this invention is employed in the manufacture of a semiconductor element, it is possible to obtain a semiconductor element which is excellent in reliability while substantially preventing any defective product from being produced in the manufacturing steps. Moreover, since the conventional PEP step can be dispensed with, the manufacturing process would be simplified without giving rise to any problem involving safety, etc.

Figure 2:
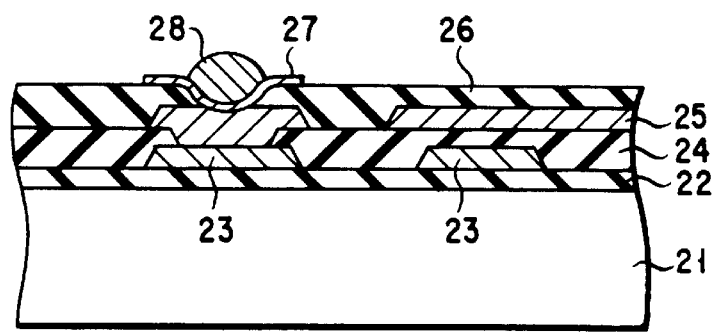
FIG. 2 is a cross-sectional view of a multi-chip module provided with an interlayer insulating film which has been obtained by patterning a film formed of a photosensitive polymer composition according to this invention.

FIG. 2 illustrates a cross-sectional view showing a portion of a multi-chip module provided with an interlayer insulation film which was formed making use of a polymer composition of this invention. In this case, the photosensitive polymer composition of Example 33 was employed for forming a patterned polyimide film to be utilized as an interlayer insulation film. In this case, the patterning of the polyimide film may be carried out in the same manner as mentioned above.

Referring to FIG. 2, a thermal oxide film 22 is formed on the surface of a silicon substrate (wafer) 21. On this thermal oxide film 22, a copper wiring 23, an interlayer insulation film 24 consisting of a polyimide film, another copper wiring 25 and another interlayer insulation film 26 consisting of a polyimide film are successively superimposed. Furthermore, a contact hole is formed at a portion of the upper interlayer insulation film 26. A Pb/Sn electrode 27 connected to the copper wiring 23 and BLM (Ball Limiting Metallization) 28 are also formed.

Since the interlayer insulation film 24 is formed through a curing of a spin-coated layer of a solution comprising a polyamic acid, the step to be formed due to the presence of the copper wiring can be greatly minimized, thus making it possible to flatten the surface of the device and to obtain a highly reliable wiring structure.

Figure 3:
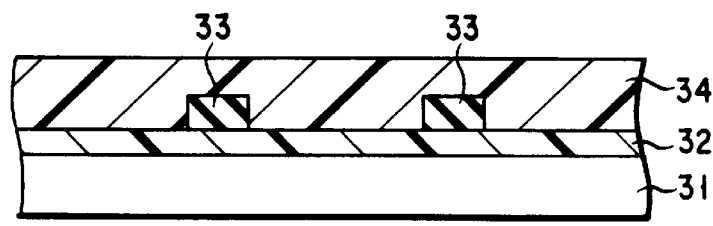
FIG. 3 is a cross-sectional view of an optical waveguide provided with a polymer core layer which has been obtained by patterning a film formed of a photosensitive polymer composition according to this invention.

FIG. 3 illustrates a cross-sectional view showing an embedded optical waveguide provided with a core layer which was formed making use of a photosensitive polymer composition of this invention. In this case, the photosensitive polymer composition of Example 48 was employed for forming a patterned polyimide film to be utilized as a core layer. In this case, the patterning of the polyimide film may be carried out in the same manner as mentioned above.

Referring to FIG. 3, a lower clad layer 32 consisting of a heat-cured PAA1 film is formed on the surface of a silicon substrate (wafer) 31. On this lower clad layer 32, a core layer 33 and an upper clad layer 34 consisting of a heat-cured PAA1 film are successively superimposed.

Since the core layer 33 can be formed easily and precisely by making use of a photosensitive polymer composition of this invention, the conventional PEP step can be dispensed with, so that the productivity of the device can be greatly improved.

Figure 4:
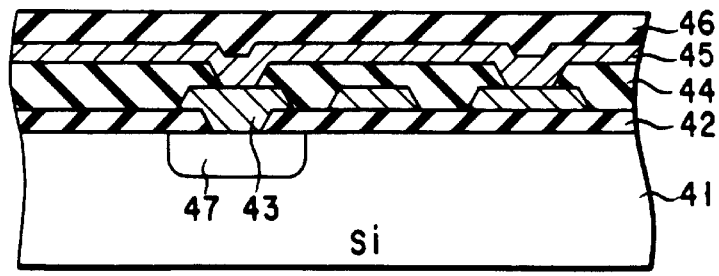
FIG. 4 is a cross-sectional view of a semiconductor element having a multilayered wiring structure comprising an interlayer insulating film which has been obtained by patterning a film formed of a photosensitive polymer composition according to this invention.

FIG. 4 illustrates a cross-sectional view showing a semiconductor element having a multilayered wiring structure provided with an interlayer insulation film which was formed making use of a polymer composition of this invention. In this case, the photosensitive polymer composition of Example 31 was employed for forming a patterned polyimide film to be utilized as an interlayer insulation film. In this case, the patterning of the polyimide film may be carried out in the same manner as mentioned above.

Referring to FIG. 4, a thermal oxide film 42 is formed on the surface of a silicon substrate (wafer) 41 bearing thereon an element region 47. A contact hole is formed at a portion of this thermal oxide film 42, and a first Al wiring 43 is formed over the contact hole. An interlayer insulation film 44 consisting of a polyimide film is superimposed on this first Al wiring 43. Furthermore, another contact hole is formed at a portion of the interlayer insulation film 44, and a second Al wiring 45 connected to the first Al wiring 43 is formed over the latter contact hole. On this second Al wiring 45 is further superimposed another interlayer insulation film 46.

Since the interlayer insulation film 44 is formed through a curing of a spin-coated layer of a solution comprising a polyamic acid, the step to be formed can be greatly minimized, thus making it possible to form multi-layered Al wirings while maintaining the flatness of the surface of the device and to obtain a highly reliable wiring structure.

As explained above, since the photosensitive polymer composition of this invention is mixed therein with a specific kind of photosensitive heat cure accelerator, it is possible, with the employment of this photosensitive polymer composition, to form a fine pattern without requiring the employment of a photoresist. Furthermore, since it is possible to perform the developing process of this photosensitive polymer composition by employing an aqueous alkaline solution, it is possible to obtain a polymer film pattern excellent in adhesion to a substrate while avoiding any excessive thinning of film and obviating any problems involving safety and environmental pollution.

It is also possible, with the employment of this photosensitive polymer composition, to provide a highly reliable electronic parts wherein a polymer film pattern excellent in electric properties, heat resistance and adhesion is utilized as an insulating member, a protecting film member, a liquid crystal device member or an optical waveguide member.

Therefore, the patterned polyimide film of this invention can be used as a wiring insulating film for an LSI, as a humidity resistant protecting film for an LSI, as an α-ray shielding film for an LSI, as a passivation film for a semiconductor device, as a wiring insulating film for a multi-chip module, as a wiring insulating film for a thin film magnetic head, as a wiring insulating film for a magnetic bubble memory, as an optical element or as an orientation film of liquid crystal display device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A negative photosensitive polymer composition, which comprises:

a thermosetting polymer precursor is cured through cyclodehydration upon heating; and a photosensitive heat cure accelerator which is capable of accelerating a curing upon irradiation of light, wherein said photosensitive heat cure accelerator is a) (4-pyridylmethyl) methacrylate, or b) a compound which is capable of generating a carboxyl group upon irradiation of light thereby exhibiting a heat cure-acceleratinig property, and is formed of an aromatic hydrocarbon compound having at least one hydroxyl group, substituted or unsubstituted amino group or mercapto group; or formed of an aromatic heterocyclic compound having at least one hydroxyl group, substituted or unsubstituted amino group or mercapto group.

2. The negative photosensitive polymer composition according to claim 1, wherein said thermosetting polymer precursor is a polyamic acid.

3. The negative photosensitive polymer composition according to claim 1, wherein said photosensitive heat cure accelerator is a).

4. The negative photosensitive polymer composition according to claim 1, wherein said composition can be developed with an aqueous alkali solution.

5. The negative photosensitive polymer composition according to claim 1, wherein said photosensitive heat cure accelerator is b).

6. The negative photosensitive polymer composition according to claim 5, wherein said photosensitive heat cure accelerator is selected from compounds represented by the following general formulas:

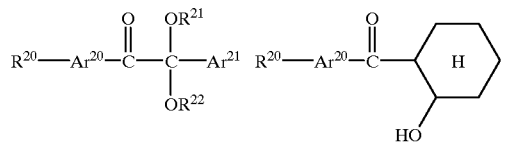

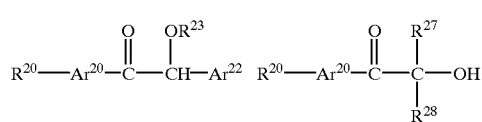

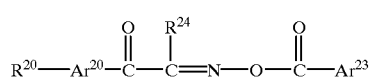

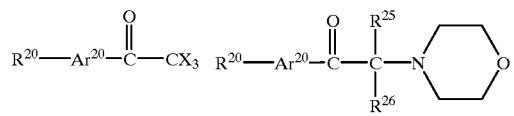

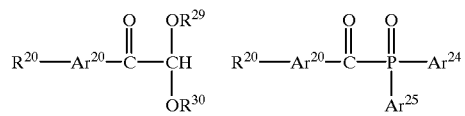

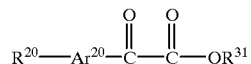

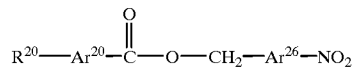

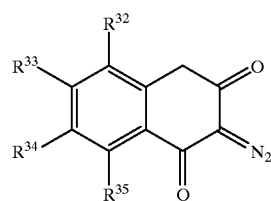

wherein $Ar^{20}$ and $Ar^{26}$ are individually bivalent substituted or unsubstituted aromatic hydrocarbon ring or aromatic heterocyclic ring; $Ar^{21}$ to $Ar^{25}$ are individually a monovalent substituted or unsubstituted aromatic hydrocarbon ring or aromatic heterocyclic ring; $R^{20}$ represents hydroxy group, primary amino group, secondary amino group, tertiary amino group, cyclic amino group or mercapto group; $R^{21}$ to $R^{31}$ are individually a substituted or unsubstituted alkyl group; $R^{32}$ to $R^{35}$ are individually hydrogen atom, halogen atom, cyano, nitro, a substituted or unsubstituted alkyl group, methoxy, hydroxyl, primary amino group, secondary amino group, tertiary amino group, cyclic amino group or mercapto group; and these groups may be connected together to form a closed ring with a proviso that at least one of them is a primary amino group, secondary amino group, tertiary amino group, cyclic amino group or mercapto group; and X is hydrogen atom or halogen atom.

7. The negative photosensitive polymer composition according to claim 5, wherein said photosensitive heat cure accelerator is selected from compounds represented by the following formulas:

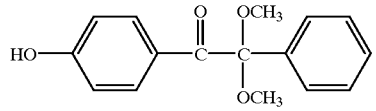
(C-1)

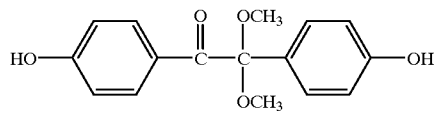
(C-2)

-continued (C-3) 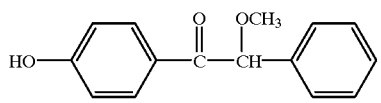

(C-4) 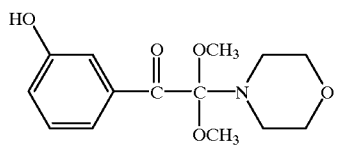

(C-5) 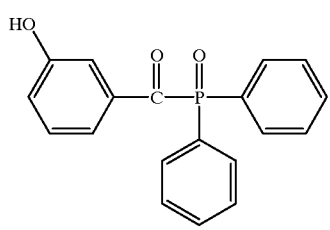

(C-6) 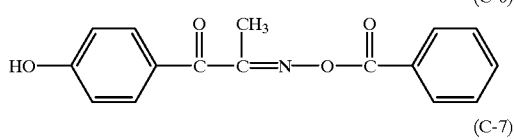

(C-7) 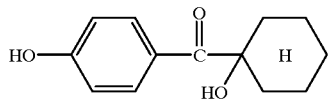

(C-8) 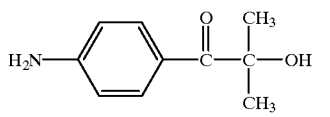

(C-9) 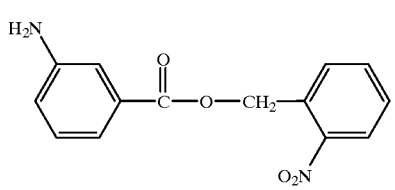

-continued (C-10) 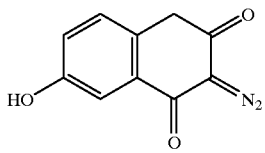

(C-11) 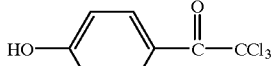

(C-12) 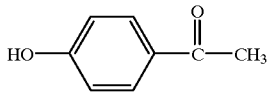

(C-13) 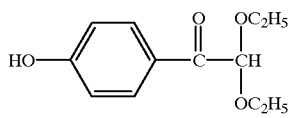

(C-14) 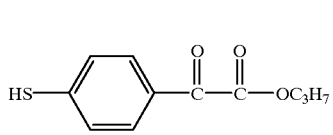

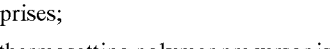

8. A negative photosensitive polymer composition, which comprises;

a thermosetting polymer precursor is cured through cyclo-dehydration upon heating; and a photosensitive heat cure accelerator which is capable of accelerating a curing upon irradiation of light, wherein the photosensitive heat cure accelerator is (4-pyridylmethyl)-methacrylate.

9. The negative photosensitive polymer composition according to claim 8, wherein said composition can be developed with an aqueous alkali solution.

* * * * *